US012726166B2

(12) United States Patent
Bader et al.

(10) Patent No.: US 12,726,166 B2
(45) Date of Patent: Sep. 1, 2026

(54) BULK ACOUSTIC WAVE DEVICE WITH PIEZOELECTRIC LAYER FORMED BY ATOMIC LAYER DEPOSITION

(71) Applicant: Skyworks Global Pte. Ltd., Singapore (SG)

(72) Inventors: Stefan Bader, Fort Collins, CO (US); Kwang Jae Shin, Yongin (KR); Kezia Cheng, Lowell, MA (US); Alexandre Augusto Shirakawa, Cardiff by the Sea, CA (US)

(73) Assignee: Skyworks Global Pte. Ltd., Singapore (SG)

( * ) Notice: Subject to any disclaimer, the term of this patent is extended or adjusted under 35 U.S.C. 154(b) by 897 days.

(21) Appl. No.: 17/937,089

(22) Filed: Sep. 30, 2022

(65) Prior Publication Data

US 2023/0108824 A1 Apr. 6, 2023

Related U.S. Application Data

(60) Provisional application No. 63/262,006, filed on Oct. 1, 2021, provisional application No. 63/262,009, filed (Continued)

(51) Int. Cl.

*H03H 3/00* (2006.01)
*H03H 3/02* (2006.01)

(Continued)

(52) U.S. Cl.

CPC ................ *H03H 3/04* (2013.01); *H03H 3/02* (2013.01); *H03H 9/02015* (2013.01); *H03H 2003/0435* (2013.01)

(58) Field of Classification Search

CPC ................ H03H 3/04; H03H 9/02015; H03H 2003/0435; H03H 2250/00; H03H 9/706;

(Continued)

(56) References Cited

U.S. PATENT DOCUMENTS

| | | | |
|---|---|---|---|
| 6,888,424 | B2 | 5/2005 | Takeuchi et al. |
| 6,975,183 | B2 | 12/2005 | Aigner et al. |

(Continued)

FOREIGN PATENT DOCUMENTS

| | | |
|---|---|---|
| CN | 110601673 | 12/2019 |
| JP | 3860695 | 12/2006 |
| JP | 4784815 | 10/2011 |

OTHER PUBLICATIONS

Aigner et al., "Pushing BAW beyond 'known' frontiers: Higher, wider, smaller, cooler", Mar. 2018.

(Continued)

*Primary Examiner* — Julio C. Gonzalez

(74) *Attorney, Agent, or Firm* — Knobbe, Martens, Olson & Bear, LLP

(57) ABSTRACT

Aspects of this disclosure relate to a bulk acoustic wave device with a plurality of piezoelectric layers having at least one polarization inversion. The bulk acoustic wave device can include a first piezoelectric layer and a second piezoelectric layer over the first piezoelectric layer. The second piezoelectric layer can be formed by atomic layer deposition. The second piezoelectric layer can have an opposite polarization relative to the first piezoelectric layer. Related filters, multiplexers, packaged radio frequency modules, radio frequency front ends, wireless communication devices, and methods are disclosed.

20 Claims, 19 Drawing Sheets

Related U.S. Application Data on Oct. 1, 2021, provisional application No. 63/262,013, filed on Oct. 1, 2021.

(51) Int. Cl.
*H03H 3/04* (2006.01)
*H03H 9/02* (2006.01)

(58) Field of Classification Search
CPC ....... H03H 2003/021; H03H 2003/025; H03H 3/02; H03H 9/02031; H03H 9/02118; H03H 9/131; H03H 9/132
See application file for complete search history.

(56) References Cited

U.S. PATENT DOCUMENTS

| | | | | |
|---|---|---|---|---|
| 7,561,010 | B2 | 7/2009 | Hikita et al. | |
| 7,719,388 | B2 | 5/2010 | Schmidhammer | |
| 9,679,765 | B2 | 6/2017 | Larson, III et al. | |
| 2005/0012568 | A1* | 1/2005 | Aigner | H03H 9/174 333/187 |
| 2007/0063622 | A1 | 3/2007 | Rudy | |
| 2013/0193808 | A1 | 8/2013 | Feng et al. | |
| 2014/0132117 | A1 | 5/2014 | Larson, III | |
| 2014/0159713 | A1* | 6/2014 | Nersessian | G01R 33/0385 324/244 |
| 2018/0138893 | A1* | 5/2018 | Caron | H04L 5/001 |
| 2019/0319772 | A1 | 10/2019 | Ando et al. | |
| 2020/0091886 | A1 | 3/2020 | Matsuo | |
| 2021/0376222 | A1* | 12/2021 | Park | H10N 30/074 |
| 2022/0321095 | A1 | 10/2022 | Liu et al. | |
| 2022/0321100 | A1 | 10/2022 | Liu et al. | |
| 2023/0109080 | A1 | 4/2023 | Bader et al. | |
| 2023/0109569 | A1 | 4/2023 | Bader et al. | |

OTHER PUBLICATIONS

Akiyama et al., "Influence of oxygen concentration in sputtering gas on piezoelectric response of aluminum nitride thin films", Applied Physics Letters vol. 93:021903-1 to 021903-3, 2008.

Alevli et al., "Optical properties of AIN thin films grown by plasma enhanced atomic layer deposition", J. Vac. Sci. Technol. A 30, 021506, published Feb. 17, 2012.

Altuntas, et al., "A Comparative Study on Electrical Characteristics of Crystalline AIN Thin Films Deposited by ICP and HCPA-Sourced Atomic Layer Deposition," Electronic Materials Letters, published Dec. 2016.

Ballandras et al., "High overtone bulk acoustic resonators: application to resonators, filters and sensors", Proceedings of the Acoustics 2012 Nantes Conference, pp. 3112-3117, Apr. 2012.

Bosund et al., "Properties of AIN grown by plasma enhanced atomic layer deposition", Applied Surface Science, vol. 257(17):7827-7830, 2011.

De Rouffignac et al., "ALD of scandium oxide from tris(N,N'-diisopropylacetamidinato)Scandium and Water", Gordon Group, Dept. of Chemistry and Chemical Biology, Harvard University, Cambridge, MA, in 16 pages, available at https://faculty.chemistry.harvard.edu/files/gordon/files/ald_scandium_avs.ald1-162005.pdf.

De Rouffignac et al., "ALD of scandium oxide from tris(N,N'-diisopropylacetamidinato)Scandium and Water", Electrochemical and Solid-State Letters, 9 (6) F45-F48, 2006.

Milyutin et al., "Sputtering of (001) AIN thin films: control of polarity by a seed layer", Journal of Vacuum Science & Technology B, 28(6):L61-L63, 2010.

Hoffmann, "Polarity control and doping in aluminum gallium nitride", Thesis Dissertation, Berlin, Jun. 10, 2013, in 145 pages.

Johnson et al., "A brief review of atomic layer deposition: from fundamentals to applications", Materials Today, vol. 17(5):236-246, 2014.

Kao et al., "AIN epitaxy on SiC by low-temperature atomic layer deposition via layer-by-layer, in situ atomic layer annealing", RSC Adv., vol. 9:12226-12231, 2019.

Larson et al., "Characterization of reversed c-axis AIN thin films", in 6 pages, 2010.

Liu et al., "Atomic layer deposition of aluminum nitride thin films from trimehtyl aluminum (TMA) and Ammonia", Mat. Res. Soc. Symp. Proc. vol. 811:D1.9.1-6, 2004.

Nguyen et al., "A film-texture driven piezoelectricity of AIN thin films grown at low temperatures by plasma-enhanced atomic layer deposition", APL Mater, vol. 8(071101):1-8, 2020.

Osterlund et al., "Atomic layer depostion of AIN using atomic layer annealing-towards high-quality AIN on vertical sidewalls", J. Vac. Sci. Technol. A 39:032403-032403-12, Mar. 2021.

Pijolat et al., "Mode conversion in high overtone bulk acoustic wave resonators", IEEE Conference Paper May 2009.

Plessky et al., "Laterally excited bulk wave resonators (XBARs) based on thin lithium niobate platelet for 5GHz and 13 GHz filters", IEEE/MTT-S International Microwave Symposium, pp. 512-515, 2019.

Shih et al., "Low-temperature atomic layer epitaxy of AIN ultrathin films by layer-by-layer, in-situ atomic layer annealing", Scientific Reports 7(39717):1-8, 2017.

Solmates, ScAIN for RF-MEMS, copyright 2021, available at: https://www.solmates-pld.com/markets/scain-for-rf-mems/ (accessed: Nov. 30, 2022).

Stutzmann et al., "Playing with polarity", Phys. Stat. Sol. (b) vol. 228(2):505-512, 2001.

Suzuki et al., "Polarization inverted (0001)/(000-1) ScAIN film resonators operating in second overtone mode", 2012 IEEE International Ultrasonics Symposium, Oct. 2021.

* cited by examiner

350
MODULE
351A
$TX_1$
$RX_1$
352
ANT
351N
$TX_N$
$RX_N$
ANT SWITCH

357
MODULE
358
351A′
359
LNA
351N′

BULK ACOUSTIC WAVE DEVICE WITH PIEZOELECTRIC LAYER FORMED BY ATOMIC LAYER DEPOSITION

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/262,006, filed Oct. 1, 2021 and titled “BULK ACOUSTIC WAVE DEVICE WITH PIEZOELECTRIC LAYER FORMED BY ATOMIC LAYER DEPOSITION,” the disclosure of which is hereby incorporated by reference in its entirety and for all purposes. This application claims the benefit of priority of U.S. Provisional Application No. 63/262,009, filed Oct. 1, 2021 and titled “METHOD OF MANUFACTURING BULK ACOUSTIC WAVE DEVICE WITH ATOMIC LAYER DEPOSITION OF PIEZOELECTRIC LAYER,” the disclosure of which is hereby incorporated by reference in its entirety and for all purposes. This application claims the benefit of priority of U.S. Provisional Application No. 63/262,013, filed Oct. 1, 2021 and titled “BULK ACOUSTIC WAVE DEVICE WITH STACKED PIEZOELECTRIC LAYERS,” the disclosure of which is hereby incorporated by reference in its entirety and for all purposes.

BACKGROUND

Technical Field

Embodiments of this disclosure relate to acoustic wave devices, such as bulk acoustic wave devices.

Description of Related Technology

An acoustic wave filter can include a plurality of resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and BAW solidly mounted resonators (SMRs). In BAW resonators, acoustic waves propagate in a bulk of a piezoelectric layer.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

Achieving a relatively high resonant frequency for an acoustic wave resonator is desirable for certain applications. However, there are technical challenges to manufacturing reliable acoustic wave devices with high resonant frequencies that meet performance specifications.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a bulk acoustic wave device with a plurality of piezoelectric layers with at least one polarization inversion. The bulk acoustic wave device includes a first electrode, a first piezoelectric layer, a second piezoelectric layer over the first piezoelectric layer, and a second electrode positioned such that at least the first piezoelectric layer and the second piezoelectric layer are between the first electrode and the second electrode. The second piezoelectric layer is formed by atomic layer deposition. The second piezoelectric layer has an opposite polarization relative to the first piezoelectric layer. The bulk acoustic wave device is configured to generate a bulk acoustic wave.

The bulk acoustic wave device can further include a third piezoelectric layer over the second piezoelectric layer, where the third piezoelectric layer has a same polarization as the second piezoelectric layer. The third piezoelectric layer can be formed by a method different than atomic layer deposition. The third piezoelectric layer can be formed by sputtering. The third piezoelectric layer can be a doped piezoelectric layer. For example, the third piezoelectric layer can be a scandium doped aluminum nitride layer. The first piezoelectric layer can include scandium doped aluminum nitride. The second piezoelectric layer can be undoped. The bulk acoustic wave device can further include a fourth piezoelectric layer over the third piezoelectric layer. The fourth piezoelectric layer can be formed by atomic layer deposition. The fourth piezoelectric layer can have an opposite polarization relative to the third piezoelectric layer. The bulk acoustic wave device can further include a fifth piezoelectric layer over the fourth piezoelectric layer. The fifth piezoelectric layer can be formed by the method different than atomic layer deposition. For example, the fifth piezoelectric layer can be formed by sputtering.

The bulk acoustic wave device can further include a third piezoelectric layer over the second piezoelectric layer. The third piezoelectric layer can be formed by atomic layer deposition and have an opposite polarization relative to the second piezoelectric layer.

The bulk acoustic wave device can excite a harmonic mode as a main mode.

The first piezoelectric layer and the second piezoelectric layer can each include aluminum nitride.

The first piezoelectric layer can be formed by a method different than atomic layer disposition. The first piezoelectric layer can be formed by sputtering.

The bulk acoustic wave device can have a resonant frequency that is over 10 gigahertz. The bulk acoustic wave device can have a resonant frequency in a range from 10 gigahertz to 20 gigahertz. The bulk acoustic wave device can have a resonant frequency in a range from 20 gigahertz to 30 gigahertz. The bulk acoustic wave device can have a resonant frequency in a range from 10 gigahertz to 40 gigahertz.

The bulk acoustic wave device can further include an interposer layer positioned between the first piezoelectric layer and the second piezoelectric layer.

The second piezoelectric layer can include oxygen in a polarization initiation zone.

Another aspect of this disclosure is an acoustic wave filter that includes a bulk acoustic wave resonator and at least one additional acoustic wave resonator together arranged to filter a radio frequency signal. The bulk acoustic wave resonator includes a first piezoelectric layer and a second piezoelectric layer over the first piezoelectric layer. The second piezoelectric layer is formed by atomic layer deposition. The second piezoelectric layer has an opposite polarization relative to the first piezoelectric layer.

The at least one additional acoustic wave resonator can include a second bulk acoustic wave resonator that includes two stacked piezoelectric layers with opposite polarizations.

The bulk acoustic wave resonator can have a resonant frequency in a range from 10 gigahertz to 40 gigahertz.

The bulk acoustic wave resonator can include a third piezoelectric layer over the second piezoelectric layer. The third piezoelectric layer can be formed by sputtering and have a same polarization as the second piezoelectric layer.

Another aspect of this disclosure is a radio frequency front end that includes an acoustic wave filter configured to filter a radio frequency signal and a radio frequency amplifier coupled to the acoustic wave filter. The acoustic wave filter includes a plurality of acoustic wave resonators. The plurality of acoustic wave resonators include a bulk acoustic wave resonator. The bulk acoustic wave resonator includes a first piezoelectric layer and a second piezoelectric layer over the first piezoelectric layer. The second piezoelectric layer is formed by atomic layer deposition. The second piezoelectric layer has an opposite polarization relative to the first piezoelectric layer.

Another aspect of this disclosure is a method of manufacturing a bulk acoustic wave device. The method includes providing a bulk acoustic wave device structure including a first piezoelectric layer and forming a second piezoelectric layer over the first piezoelectric layer by atomic layer deposition. The second piezoelectric layer has an opposite polarization relative to the first piezoelectric layer.

The method can further include depositing a third piezoelectric layer over the second piezoelectric layer using a process different than atomic layer deposition. The third piezoelectric layer can be sputtered. The third piezoelectric layer can have a same polarization as the second piezoelectric layer. The third piezoelectric layer can be a doped piezoelectric layer. For example, the third piezoelectric layer can be a scandium doped aluminum nitride layer. The first and third piezoelectric layers can be scandium doped aluminum nitride layers. The method can further include depositing a fourth piezoelectric layer over the third piezoelectric layer by atomic layer deposition. The fourth piezoelectric layer can have an opposite polarization relative to the third piezoelectric layer. The method can further include depositing a fifth piezoelectric layer over the fourth piezoelectric layer.

The method can further include forming a third piezoelectric layer over the second piezoelectric layer by atomic layer deposition, in which the third piezoelectric layer has a same polarization as the first piezoelectric layer.

At least one of the first piezoelectric layer and the second piezoelectric layer can include aluminum nitride.

The method can further include puttering the first piezoelectric layer.

The bulk acoustic wave device structure can include a first electrode under the first piezoelectric layer. The method can further include forming a second electrode over the second piezoelectric layer such that at least the first piezoelectric layer and second piezoelectric layer are included between the first electrode and the second electrode.

A bulk acoustic wave device formed by the method can have a resonant frequency that is over 10 gigahertz. A bulk acoustic wave device formed by the method can have a resonant frequency in a range from 10 gigahertz to 20 gigahertz. A bulk acoustic wave device formed by the method can have a resonant frequency in a range from 20 gigahertz to 30 gigahertz. A bulk acoustic wave device formed by the method can have a resonant frequency in a range from 10 gigahertz to 40 gigahertz.

The second piezoelectric layer can be a scandium doped aluminum nitride layer. An oxygen source can be included in vapor for the atomic layer deposition of the second piezoelectric layer.

Another aspect of this disclosure is a method of manufacturing a bulk acoustic wave device. The method includes providing a bulk acoustic wave device structure that includes a first aluminum nitride piezoelectric layer and forming a second aluminum nitride piezoelectric layer over the first aluminum nitride piezoelectric layer by atomic layer deposition. The second aluminum nitride piezoelectric layer has an inverted polarization relative to the first aluminum nitride piezoelectric layer.

The method can further include depositing a third aluminum nitride piezoelectric layer over the second aluminum nitride piezoelectric layer. The third aluminum nitride layer piezoelectric layer can include a dopant. The third aluminum nitride piezoelectric layer can have a same polarization as the second aluminum nitride piezoelectric layer.

The method can further include forming another aluminum nitride piezoelectric layer over the second aluminum nitride piezoelectric layer by atomic layer deposition.

Another aspect of this disclosure is a method of manufacturing a bulk acoustic wave device. The method includes sputtering a first piezoelectric layer over a first electrode; depositing a second piezoelectric layer over the first piezoelectric layer by atomic layer deposition, the second piezoelectric layer having an inverted polarization relative to the first piezoelectric layer; sputtering a third piezoelectric layer directly over the second piezoelectric layer, the third piezoelectric layer having a same polarization as the second piezoelectric layer; and forming a second electrode over the third piezoelectric layer such that a stack of piezoelectric layers is positioned between the first electrode and the second electrode, the stack of piezoelectric layers including at least the first, second and third piezoelectric layers.

The third piezoelectric layer can include aluminum nitride. The third piezoelectric layer can be doped with scandium.

Another aspect of this disclosure is a bulk acoustic wave device with stacked of piezoelectric layers. The bulk acoustic wave device includes a first electrode, a second electrode, and a plurality of stacked piezoelectric layers positioned between the first electrode and the second electrode. The plurality of stacked piezoelectric layers includes a piezoelectric layer formed by atomic layer deposition. The bulk acoustic wave device is configured to excite an overtone mode as a main mode.

The plurality of stacked piezoelectric layers can include a piezoelectric layer formed by sputtering that is directly over the piezoelectric layer formed by atomic layer deposition. The piezoelectric layer formed by sputtering can have a same polarization as the piezoelectric layer formed by atomic layer deposition.

The plurality of stacked piezoelectric layers can include a piezoelectric layer formed by sputtering that is directly under the piezoelectric layer formed by atomic layer deposition. The piezoelectric layer formed by sputtering can have an opposite polarization as the piezoelectric layer formed by atomic layer deposition.

The plurality of stacked piezoelectric layers can include a second piezoelectric layer formed by atomic layer deposition.

The plurality of stacked piezoelectric layers can include alternating piezoelectric layers formed by atomic layer deposition and piezoelectric layers formed by a method different than atomic layer deposition. At least one of the piezoelectric layers formed by the method different than atomic layer deposition can include a dopant. Each of the piezoelectric layers formed by the method different than atomic layer deposition can include a dopant. The dopant can be scandium.

The plurality of stacked piezoelectric layers can include a doped piezoelectric layer, and the piezoelectric layer formed by atomic layer deposition can be undoped.

Each of the plurality of stacked piezoelectric layers can include aluminum nitride.

The overtone mode can have a frequency in a range from 10 gigahertz to 40 gigahertz. The overtone mode can have a frequency in a range from 20 gigahertz to 30 gigahertz. The overtone mode can have a frequency in a range from 24 gigahertz to 30 gigahertz. The overtone mode can have a frequency in a range from 10 gigahertz to 20 gigahertz.

The bulk acoustic wave device can further include an interposer layer positioned between the piezoelectric layer formed by atomic layer deposition and another one of the plurality of stacked piezoelectric layers.

Another aspect of this disclosure is a packaged radio frequency module that includes an acoustic wave filter configured to filter a radio frequency signal, a radio frequency circuit element, and a package structure enclosing the acoustic wave filter and the radio frequency circuit element. The acoustic wave filter includes bulk acoustic wave resonator. The bulk acoustic wave resonator includes a plurality of stacked piezoelectric layers. The plurality of stacked piezoelectric layers includes a piezoelectric layer formed by atomic layer deposition. The bulk acoustic wave resonator is configured to excite an overtone mode as a main mode.

The overtone mode can have a frequency in a range from 10 gigahertz to 40 gigahertz.

The radio frequency circuit element can include a radio frequency switch. The radio frequency circuit element can include a radio frequency amplifier.

Another aspect of this disclosure is a method of filtering a radio frequency signal. The method includes receiving a radio frequency signal at an acoustic wave filter that includes a bulk acoustic wave resonator, the bulk acoustic wave resonator including a plurality of stacked piezoelectric layers, the plurality of stacked piezoelectric layers including a piezoelectric layer formed by atomic layer deposition, and the bulk acoustic wave resonator configured to excite an overtone mode as a main mode; and filtering the radio frequency signal with the acoustic wave filter.

Another aspect of this disclosure is a wireless communication device that includes an acoustic wave filter in accordance with any suitable principles and advantages disclosed herein and an antenna operatively coupled to the acoustic wave filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/937,175, titled "METHODS OF MANUFACTURING BULK ACOUSTIC WAVE DEVICE WITH ATOMIC LAYER DEPOSITION OF PIEZOELECTRIC LAYER," filed on even date herewith, the entire disclosure of which is hereby incorporated by reference herein. The present disclosure also relates to U.S. patent application Ser. No. 17/937,137, titled "BULK ACOUSTIC WAVE DEVICE WITH STACKED PIEZOELECTRIC LAYERS," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
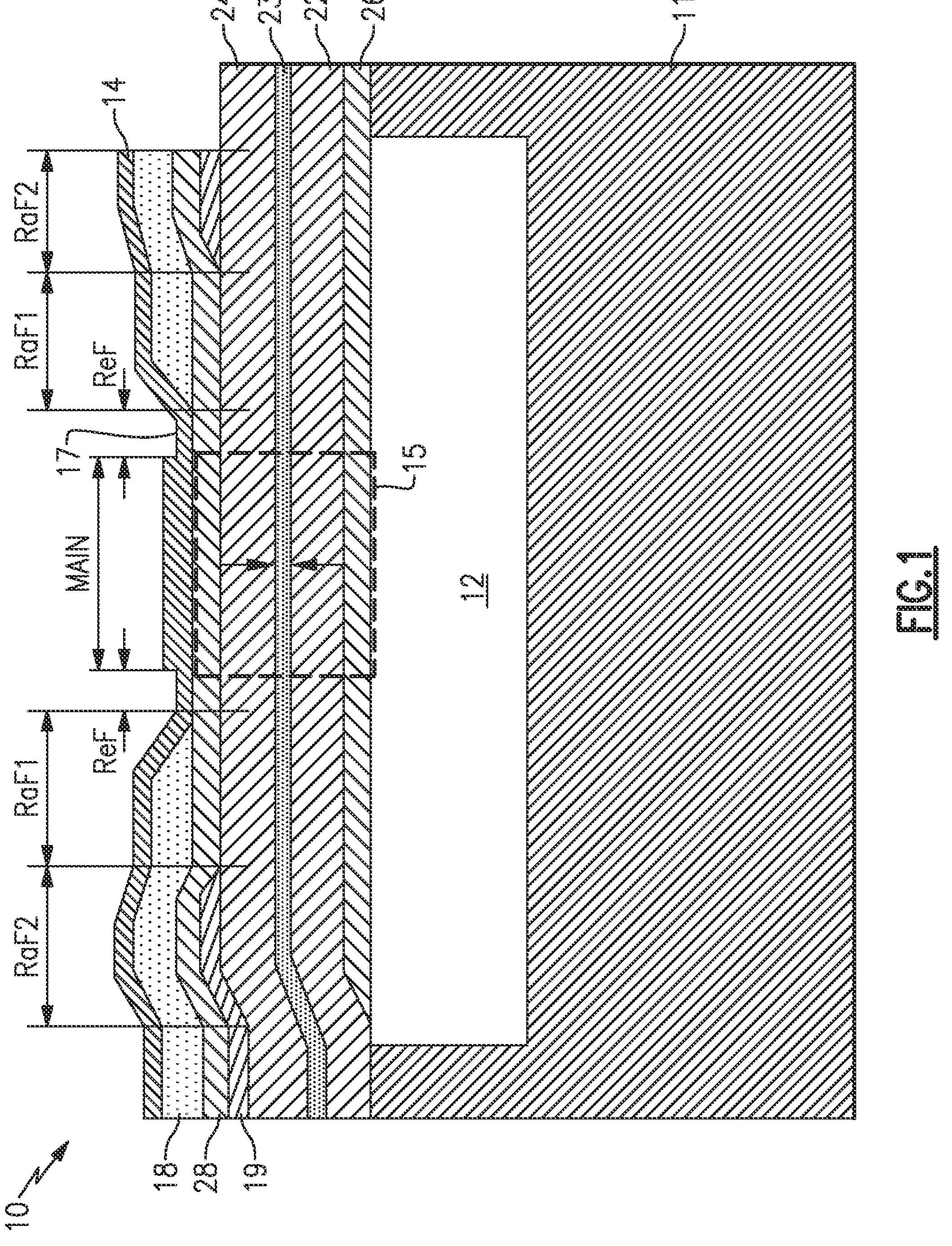
FIG. 1 is a schematic cross-sectional diagram of a bulk acoustic wave (BAW) device that includes a piezoelectric layer formed by atomic layer deposition (ALD) in a plurality of stacked piezoelectric layers according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As demand increases for filtering radio frequency signals with higher frequencies, acoustic wave resonators with higher resonant frequencies are desired. Bulk acoustic wave (BAW) resonators are moving to increasingly higher resonant frequencies approaching 10 gigahertz (GHz). Bulk acoustic wave (BAW) resonators can use a fundamental mode as a main mode. In such BAW resonators, higher resonant frequencies can be achieved by reducing thickness for the piezoelectric and/or electrode layers. BAW resonators with a thinner layer stack have generally provided higher resonant frequencies. Thinner electrodes can also contribute to a higher resonant frequency for a BAW resonator.

Thinner BAW stacks present technical challenges. With a thinner stack, BAW resonators are typically more fragile. Overall thickness of thinner BAW stacks can be problematic for mechanical stability of a BAW resonator. BAW resonators with thin stacks can be problematic for post-release processing, such as trimming, applying photoresists, and/or other processing that applies stress on a BAW resonator structure. BAW resonators with relatively thin stacks can have relatively high resistivity. BAW resonators with relatively thin stacks can encounter technical challenges related to power handling. Moreover, thinner electrode layers can have higher electrode resistance that can reduce performance.

A BAW resonator with a fundamental mode as a main mode can have a stack thickness of $\lambda/2$, where $\lambda$ is a wavelength of a bulk acoustic wave generated by the BAW resonator. Operating a BAW resonator at an n-th harmonic of the fundamental frequency can increase the thickness of the BAW stack by roughly $n*\lambda/2$, where n is an integer greater than 1. An advantage of operating at higher harmonics is that for a given frequency and impedance, resonator size can increase due to the increased total piezoelectric layer thickness and thus reduce capacitance. This can reduce edge losses.

BAW devices can operate with a harmonic mode as a main mode. Such BAW devices can include a plurality of stacked piezoelectric layers positioned between electrodes. The stacked piezoelectric layers can include adjacent piezoelectric layers having inverted c-axis polarizations. BAW devices with a harmonic mode as a main mode can include stacked piezoelectric layers with polarization inversion. The harmonic mode is an overtone mode.

For very high frequencies (e.g., 30+ GHz), when $\lambda/2$ becomes small, the number of polarization inverted layers can become relatively large (e.g., >10) to achieve a reliable and robust total stack thickness d, where $$n = d/\left(\frac{\lambda}{2}\right).$$

Piezoelectric materials may have no center of symmetry and no initial polarization. Polarization can be caused by stress and/or deformation. A direction of polarization of a given deformation can depend on stacking of atomic layers of a piezoelectric material. For example, an aluminum nitride (AlN) piezoelectric layer can have a polarization that depends on the stacking of aluminum and nitrogen layers. The first deposited layer can determine the direction in which the material polarizes.

For typical electrode materials (e.g., molybdenum, tungsten, or ruthenium) used in mass-manufactured BAW processes, N-type polarization is the typical polarization for an AlN piezoelectric layer. From a mass-manufacturing standpoint, it has been difficult and/or expensive to invert the polarization of an AlN layer using conventional techniques. Using doped piezoelectric layers, such as scandium doped AlN (AlScN), has made polarization inversion more difficult.

In this disclosure, technical solutions related to depositing AlN by atomic layer deposition (ALD) for polarization inversion are disclosed.

Precursors for AlN have been developed for depositing AlN films by ALD. AlN films can be deposited by thermal ALD or plasma enhanced ALD processes. Such ALD processes can produce high quality polycrystalline films. With ALD, a first deposited layer of an AlN film can be either aluminum or nitrogen. This first deposited layer can set a polarization of the AlN film. In addition, the polarization of a sputtered AlN layer over the ALD deposited AlN layer can have the same polarization as the underlying ALD deposited layer.

Aspects of this disclosure relate to a BAW device with a plurality of stacked piezoelectric layers where an ALD deposited piezoelectric layer has an opposite polarization as an underlying piezoelectric layer. The BAW device can operate with a harmonic mode as a main mode. Such a BAW device can have a high resonant frequency. At the same time, desirable mechanical stability can be achieved. The ALD deposited piezoelectric layer can invert polarization in the piezoelectric stack. The ALD deposited piezoelectric layer can be a few nanometers thick. Another piezoelectric layer can be sputtered over the ALD deposited piezoelectric layer. The sputtered piezoelectric layer can have a same polarization as the ALD deposited piezoelectric layer. The sputtered piezoelectric layer can be thicker than the ALD deposited piezoelectric layer. In certain applications, the sputtered piezoelectric layer can be doped. Using ALD deposited piezoelectric layers, any suitable number of polarization inversions can be implemented in a piezoelectric layer stack between electrodes of a bulk acoustic wave device.

Although embodiments disclosed herein may be described with reference to sputtering, any other suitable deposition process can be used in place of sputtering in accordance with any suitable principles and advantages disclosed herein. The other deposition process can be different than ALD. Pulsed laser deposition (PLD) is one example of a deposition process that can be used in place of sputtering. A piezoelectric stack can include at least one piezoelectric layer formed by ALD and at least one piezoelectric layer formed by PLD in accordance with any suitable principles and advantages disclosed herein. Metal organic chemical vapor deposition (MOCVD) is another example of a deposition process that can be used in place of sputtering. A piezoelectric stack can include at least one piezoelectric layer formed by ALD and at least one piezoelectric layer formed by MOCVD in accordance with any suitable principles and advantages disclosed herein.

Aspects of this disclosure relate to a BAW device with a high resonant frequency that includes a plurality of stacked piezoelectric layers including at least one piezoelectric layer formed by ALD. The plurality of stacked piezoelectric layers is positioned between electrodes of the BAW device. The BAW device is configured to excite an overtone mode as a main mode. The ALD deposited piezoelectric layer can invert polarization in the plurality of stacked piezoelectric layers. The stacked piezoelectric layers can include a plurality of ALD deposited piezoelectric layers to invert polarization of the stacked piezoelectric layers a plurality of times. The number of polarization inversions can depend on a desired target frequency, reliability considerations, and/or one or more other technical specifications. Electrodes, passivation and other structural layers can be part of an $n*\lambda/2$ stack. These layers can be acoustically incorporated into the stack. Such BAW devices can be BAW resonators for filters. Such filters can filter radio frequency signals.

BAW devices disclosed herein with stacked piezoelectric layers including one or more ALD deposited piezoelectric layers can achieve a relatively high resonant frequency and also achieve other desirable properties. The BAW devices disclosed herein can achieve one or more of desirable mechanical stability, desirable power handling, relatively high electromechanical coupling coefficient ($k^2$), or suppression of one or more non-linearity excitation responses.

With stacked piezoelectric layers, a BAW device can have a thicker piezoelectric stack than a BAW device with a single piezoelectric layer with the same resonant frequency. The stacked piezoelectric layers can increase mechanical stability of the BAW device. This can be useful in post-release processing. Depositing a piezoelectric layer with ALD provides a method of inverting piezoelectric layer polarization suitable for mass manufacturing of BAW devices. For a given frequency and impedance, resonator size can increase due to the increased total piezoelectric layer thickness and reduced capacitance accordingly. This can reduce edge losses.

With stacked piezoelectric layers between electrodes exciting a harmonic mode, a BAW device can achieve a relatively high resonant frequency with a thicker piezoelectric stack than a BAW device with a single piezoelectric layer with the same resonant frequency. The BAW device with stacked piezoelectric layers can have better power handling. This can be advantageous in transmit filters. Moreover, better power handling can be advantageous for certain fifth generation (5G) New Radio (NR) applications with relatively high power. BAW devices disclosed herein can suppress one or more non-linearity excitation responses. Suppressing non-linearities can contribute to meeting stringent 5G NR system level linearity specifications. In 5G NR applications, BAW devices disclosed herein can be used for filtering higher frequency ranges than used in certain previous applications for BAW devices.

Any suitable principles and advantages disclosed herein can be implemented in a suitable acoustic wave resonator, such as film bulk acoustic wave resonator (FBAR), a BAW solidly mounted resonator (SMR), a stacked BAW resonator with piezoelectric layers with different c-axis orientations on opposing sides of an electrode, a Lamb wave resonator, or the like. Any suitable principles and advantages disclosed herein can be implemented in an acoustic wave device that generates an acoustic wave in a stack of piezoelectric layers.

Example BAW devices with a plurality of stacked piezoelectric layers that include at least one piezoelectric layer deposited by ALD will now be discussed. The piezoelectric layer deposited by ALD can invert polarization in a piezoelectric stack. Any suitable principles and advantages of these BAW devices can be implemented together with each other.

Figure 3:
FIG. 3 is a cross sectional schematic diagram of a portion of the electrode and piezoelectric stack of the BAW device of FIG. 1.
Figure 3:
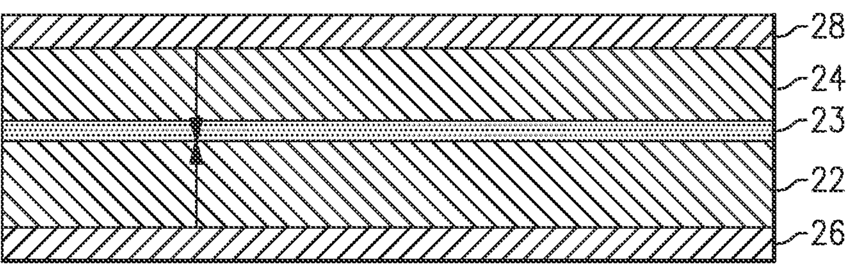

FIG. 1 is a cross sectional diagram of a BAW device 10 according to an embodiment. The BAW device 10 includes stacked piezoelectric layers with a piezoelectric layer deposited by ALD. As illustrated, the BAW device 10 includes a support substrate 11, an air cavity 12, a passivation layer 14, and an electrode and piezoelectric stack 15. The BAW device 10 also includes a recessed frame structure 17 and raised frame layers 18 and 19. The electrode and piezoelectric stack 15 includes a plurality of piezoelectric layers 22, 23, and 24, a first electrode 26, and a second electrode 28. Part of the electrode and piezoelectric stack 15 of the BAW device 10 is shown in FIG. 3. The part of the electrode and piezoelectric stack 15 is in a main acoustically active region of the BAW device 10. More details regarding the piezoelectric layers 22, 23 and 24, the first electrode 26, and the second electrode 28 will be discussed with reference to FIG. 3.

An active region or active domain of the BAW device 10 can be where voltage is applied on opposing sides of the stack of piezoelectric layers over an acoustic reflector, such as the air cavity 12 or a solid acoustic mirror. The illustrated BAW device 10 includes a main acoustically active region Main, a recessed frame region ReF with the recessed frame structure 17, a first raised frame region RaF1 with the first raised frame layer 18, and a second raised frame region RaF2 with the first raised frame layer 18 and the second raised frame layer 19. The main region Main can be a majority of the area of the BAW device 10. The main acoustically active region Main can provide a main mode of the BAW device 10. The main acoustically active region Main can be the central part of the active region that is free from the frame structures, such as raised and recessed frame structures. While the BAW device 10 includes the recessed frame structure 17 and the raised frame layers 18 and 19, other frame structures can alternatively or additionally be implemented. Moreover, a BAW device in accordance with any suitable principles and advantages disclosed herein can be implemented without a recessed frame structure and/or without a raised frame structure.

The first raised frame layer 18 is positioned between the second electrode 28 and the passivation layer 14. The first raised frame layer 18 can be a relatively high acoustic impedance material. For instance, the first raised frame layer 18 layer can include Mo, W, Ru, Ir, Cr, Pt, the like, or any suitable alloy thereof. The first raised frame layer 18 layer can be a metallic layer. In such embodiments, the first raised frame layer 18 can be referred to as a metal raised frame layer. Alternatively, the first raised frame layer 18 can be a suitable non-metal material with a relatively high density. In some instances, first raised frame layer 18 can be of the same material as the electrode 28 of the BAW device 10.

The second raised frame layer 19 can have a relatively lower acoustic impedance. The second raised frame layer 19 can have a lower acoustic impedance than the piezoelectric layers of the BAW device 10. The second raised frame layer 19 can be an oxide, such as a silicon oxide. Such a second raised frame layer 19 can be referred to as an oxide raised frame layer. The second raised frame layer 19 can be a dielectric layer. The second raised frame layer 19 layer can include one or more of an oxide, a metal, or a polymer. The second raised frame layer 19 can include, for example, a $SiO_2$ layer, a SiN layer, a SiC layer, or any other suitable low acoustic impedance material. Because $SiO_2$ is already used in a variety of bulk acoustic wave devices, a $SiO_2$ second raised frame layer 19 can be relatively easy to manufacture.

The air cavity 12 is an example of an acoustic reflector. As illustrated, the air cavity 12 is etched into the support substrate 11. In some other applications, an air cavity can be over a support substrate. The air cavity 12 is positioned between the support substrate 11 and the first electrode 26. The support substrate 11 can be a silicon substrate. The support substrate 11 can be any other suitable support substrate.

The passivation layer 14 can be referred to as an upper passivation layer. The passivation layer 14 can be a silicon dioxide layer or any other suitable passivation layer, such as aluminum oxide, silicon carbide, aluminum nitride, silicon nitride, silicon oxynitride, or the like. The passivation layer 14 can have different thicknesses in different regions of the BAW device 10. Part of the second passivation layer 14 can form at least part of a frame structure. As illustrated in FIG. 1, the passivation layer 14 is thinner in the recessed frame region ReF. The recessed frame structure 17 includes the thinner part of the passivation layer that is non-overlapping with raised frame layers 18 and 19. While not shown in FIG. 1, the BAW device 10 can include a passivation layer positioned between the air cavity 12 and the first electrode 26.

Figure 2A:
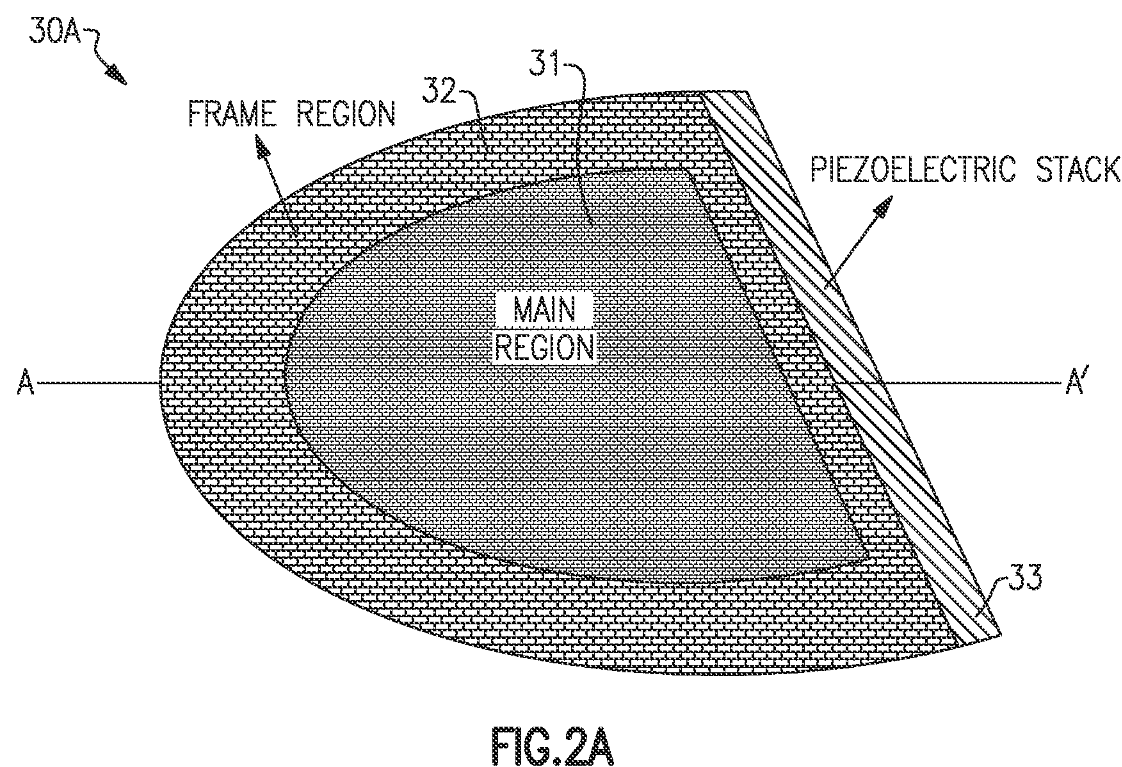
FIG. 2A schematically illustrates an example plan view of a BAW device.
Figure 2B:
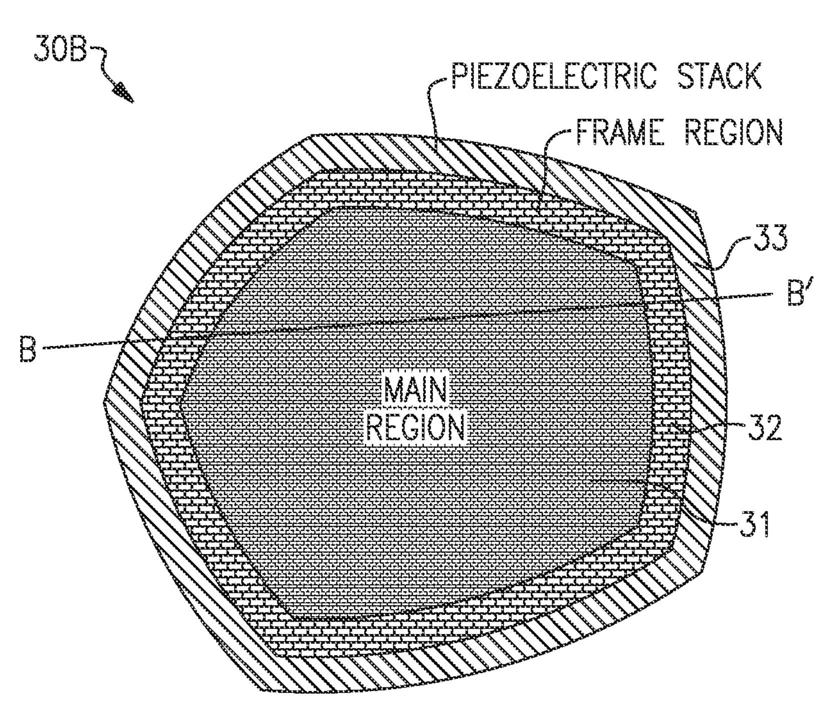
FIG. 2B schematically illustrates another example plan view of a BAW device.

A frame region can surround the main acoustically active region of a BAW device in plan view. The main acoustically active region can be most of the area of a BAW device. The relative size of the main region to the frame region shown in FIGS. 2A and 2B is closer to the actual relative size than shown in FIG. 1. FIG. 2A shows an example frame region 32 surrounding a main acoustically active region 31 in plan view. These regions are shown over a piezoelectric stack 33. The cross-sectional views in the drawings can be along the line A-A' in FIG. 2A in certain embodiments. A BAW device 30A shown in FIG. 2A has a semi-circular or semi-elliptical shape in plan view. The piezoelectric stack 33 includes one or more piezoelectric layers deposited by ALD in accordance with any suitable principles and advantages disclosed herein. The frame region 32 can include one or more raised frame regions and/or one or more recessed framed regions.

A BAW device in accordance with any suitable principles and advantages disclosed herein can alternatively have any other suitable shape in plan view, such as a quadrilateral shape, a quadrilateral shape with curved sides, a pentagon shape, a pentagon shape with curved sides, or the like. For example, FIG. 2B shows another example of another BAW device 30B with a frame region 32 surrounding a main acoustically active region 31 in plan view. The BAW device 30B shown in FIG. 2B has a pentagon shape with rounded sides in plan view. The cross-sectional views in the drawings can be along the line B-B' in FIG. 2B in certain embodiments. The piezoelectric stack 33 includes one or more piezoelectric layers deposited by ALD in accordance with any suitable principles and advantages disclosed herein. The frame region 32 shown in FIG. 2B can include one or more raised frame regions and/or one or more recessed framed regions.

FIG. 3 is a cross sectional schematic diagram of a portion of the electrode and piezoelectric stack 15 of the BAW device 10 of FIG. 1. FIG. 3 illustrates the electrodes 26 and 28 and piezoelectric layers 22, 23, and 24 in a main acoustically active region of the BAW device 10. In the electrode and piezoelectric stack 15, the piezoelectric layers 22, 23, and 24 are stacked with each other and sandwiched between the first electrode 26 and the second electrode 28. In the electrode and piezoelectric stack 15, the piezoelectric layers 22, 23, and 24 are acoustically coupled with each other.

As shown in FIG. 3, the first piezoelectric layer 22 and the second piezoelectric layer 23 have c-axes oriented in different directions. The c-axis of the first piezoelectric layer 22 is oriented in an opposite direction than the c-axis of the second piezoelectric layer 23.

The first piezoelectric layer 22 can be formed by sputtering, such as physical vapor deposition (PVD) sputtering. The first piezoelectric layer 22 can be an AlN layer. The second piezoelectric layer 23 is formed by ALD. Due to the material of the first electrode 26, the first piezoelectric layer 22 can have a first polarization. The first polarization can be an N-type polarization. N-type polarization is where a nitrogen layer is first for an AlN layer. An AlN piezoelectric layer with N-type polarization can be referred to as being N-polar.

With ALD, different layers can be alternately and sequentially deposited to form a thin film. For example, to form an AlN piezoelectric layer 23, an aluminum layer can be deposited and then a nitrogen layer can be deposited on the aluminum layer. As another example, to form an AlN piezoelectric layer, a nitrogen layer can be deposited and then an aluminum layer can be deposited on the nitrogen layer. The first deposited layer for AlN can set the polarization of an ALD deposited AlN layer. Depositing aluminum first can set the polarization of the AlN layer formed by ALD to an opposite polarization than an AlN layer formed by ALD where nitrogen is deposited first.

An aluminum nitride piezoelectric layer can be doped or undoped. Piezoelectric layers deposited by ALD that include aluminum nitride can also include one or more additional elements, such as a dopant and/or oxygen, in certain applications. An Al(Sc)N piezoelectric layer can be deposited by ALD using a scandium precursor. An AlON film can be deposited by ALD with a variety of oxygen to nitrogen ratios. In certain applications, an Al(Sc)ON piezoelectric can be deposited by ALD. The piezoelectric layers deposited by ALD disclosed herein can include one or more additional elements other than aluminum and nitrogen as suitable.

The second piezoelectric layer 23 can have a second polarization. The second polarization can be an Al-type polarization for an AlN second piezoelectric layer 23. Al-type polarization is where an aluminum layer is first. An AlN piezoelectric layer with Al-type polarization can be referred to as being Al-polar. For AlN, N-type polarization and Al-type polarization are opposite polarizations. An AlN layer with N-type polarization has material with an opposite orientation relative to an AlN layer with Al-type polarization. In contrast, two AlN layers with N-type polarization have the same orientation. Similarly, two AlN layers with Al-type polarization have the same orientation.

As shown in FIG. 3, the second piezoelectric layer 23 is deposited by ALD to have an opposite polarization relative to the underlying first piezoelectric layer 22. Polarization can be referred to as polarity. With opposite polarizations, the c-axis of the first piezoelectric layer 22 is oriented in an opposite direction relative to the c-axis of the second piezoelectric layer 23 in FIG. 3. Two c-axes are oriented in opposite directions relative to each other when one of c-axes is rotated 180° relative to the other of the c-axes. Two c-axes can be oriented in opposite directions relative to each other when one of c-axes is rotated by an angle in a range from 170° to 190° relative to the other of the c-axes.

The second piezoelectric layer 23 can be a relatively thin layer deposited by ALD. For example, the second piezoelectric layer 23 can be formed by ALD cycles to have a thickness in a range from 1 nanometer (nm) to 50 nm, such as in a range from 1 nm to 10 nm. The second piezoelectric layer 23 can be an ALD deposited template layer that sets polarization of a layer that is sputtered over the second piezoelectric layer 23.

The third piezoelectric layer 24 can be formed by sputtering over the second piezoelectric layer 23. The third piezoelectric layer 24 can be formed directly over the second piezoelectric layer 23. By forming the third piezoelectric layer 24 by sputtering, the third piezoelectric layer 24 can have the same polarization as the second piezoelectric layer 23. For example, both the second and third piezoelectric layers 23 and 24, respectively, can be AlN layers with Al-type polarization. The ALD deposited second piezoelectric layer 23 can invert polarization in the electrode and piezoelectric stack 15. The piezoelectric layers 22 and 24 formed by sputtering can be thicker than the piezoelectric layer 23 formed by ALD. The piezoelectric layer 22 and the piezoelectric layer 24 can each have a thickness of about λ/2. The piezoelectric layer 22 and/or the piezoelectric layer 24 can have a thickness in a range from 20 nm to 2000 nm, such as in a range from 30 nm to 100 nm.

As illustrated in FIG. 3, the c-axes of the piezoelectric layers 22, 23, and 24 are each oriented perpendicular to a planar surface of the first electrode 26. Similarly, the c-axis of the piezoelectric layers 22, 23, and 24 are each oriented perpendicular to a planar surface of the second electrode 28 in FIG. 3. The c-axes the piezoelectric layers 22, 23, and 24 can each be substantially perpendicular to a planar surface of the first electrode 26 and/or a planar surface of the second electrode 28. Such substantially perpendicular c-axes can be oriented at an angle in a range from 85° to 95° relative to a planar surface of an electrode. While a piezoelectric layer with a c-axis substantially perpendicular to a planar electrode surface is preferred in certain applications, any other suitable c-axis orientation can be implemented for a particular application.

The arrangement of the stacked piezoelectric layers 22, 23 and 24 can excite a second harmonic mode as a main mode for the BAW resonator 10. The second harmonic mode has a resonant frequency that can be about 2 times a resonant frequency of a fundamental mode of the BAW device 10. The resonant frequency for the second harmonic mode may not be exactly 2 times a resonant frequency of the fundamental mode, for example, due to contributions of the electrodes 26 and 28 of the BAW device 10 to resonant frequency.

Figure 11:
FIG. 11A is a cross sectional schematic diagram of a portion of a BAW device with a plurality of stacked doped piezoelectric layers an embodiment.
FIG. 11B is a cross sectional schematic diagram of a portion of a BAW device with a plurality of stacked doped piezoelectric layers with N−1 polarization inversions according to an embodiment.
Figure 11:
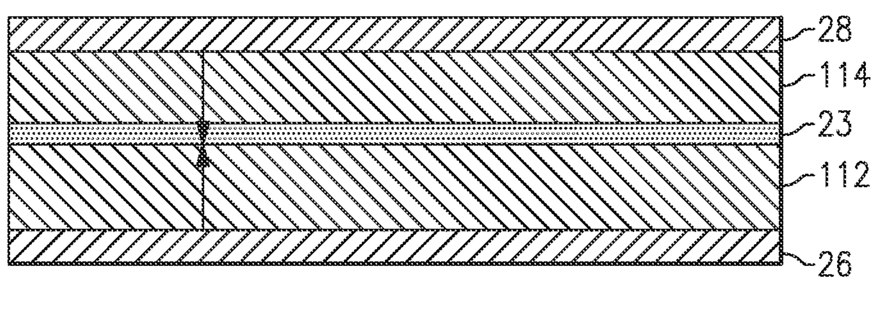
Figure 11:
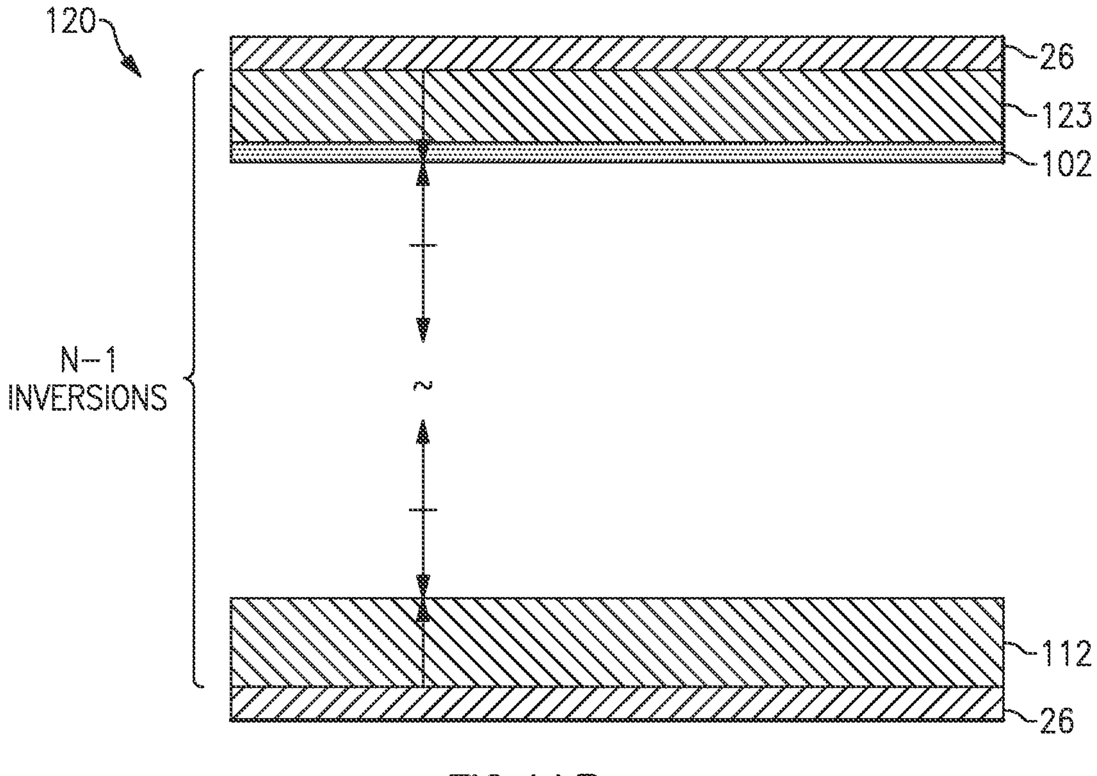

The piezoelectric layers 22, 23, and 24 can each include a same piezoelectric material. The piezoelectric layers 22, 23, and 24 can each include aluminum nitride. Piezoelectric layers that include aluminum nitride can be doped (e.g., with scandium) or undoped. The piezoelectric layers 22, 23, and 24 can include any suitable piezoelectric material. For example, the piezoelectric layers 22, 23, and 24 can include zinc oxide (ZnO). As another example, the piezoelectric layers 22, 23, and 24 can include gallium nitride (GaN), or indium nitride (InN). Sputtered piezoelectric layers can be doped in certain embodiments. More details regarding doped piezoelectric layers will be provided, for example, with reference to FIG. 11A.

Piezoelectric layers formed by ALD and piezoelectric layers formed by other methods, such as sputtering, are physically different. Piezoelectric layers formed by ALD and piezoelectric layers formed by other methods can have one or more different properties that are detectable. As an example, there can be different impurities in an ALD deposited piezoelectric layer than a sputtered piezoelectric layer of the same material. ALD can involve organic precursors, and ALD deposited piezoelectric layers can include impurities from one or more of such precursors. Various methods, such as energy-dispersive x-ray spectroscopy (EDS) or Rutherford backscattering, can detect carbon from organic precursors in piezoelectric layers from by ALD. As another example, an ALD deposited piezoelectric layer can have a different grain structure and/or a different grain size than a sputtered piezoelectric layer of the same material. Transmission electron microscopy (TEM) can be used to distinguish between ALD and sputtered piezoelectric layers from a grain size point of view. In certain applications, ALD deposited piezoelectric layer can have larger grain sizes than a sputtered piezoelectric layer of the same material. In certain applications, a piezoelectric stack includes a sputtered piezoelectric layer that is doped and an ALD deposited layer that is undoped.

The first piezoelectric layer 22 can have approximately the same thickness as the third piezoelectric layer 24 in certain applications. The first piezoelectric layer 22 and the third piezoelectric layer 24 can have any suitable relative sizes for a particular application. For instance, the first piezoelectric layer 22 and the third piezoelectric layer 24 can have an approximately 60/40 ratio in certain applications. The ratio of the first piezoelectric layer 22 thickness and the third piezoelectric layer 24 thickness can be selected based on parasitics associated with the BAW device 10 that includes the piezoelectric layers 22 and 24. For example, relative sizes of the piezoelectric layers 22 and 24 can be selected to provide stronger suppression of a non-linearity in the presence of parasitics that impact the piezoelectric layers 22 and 24.

The first electrode 26 can be referred to as a lower electrode. The first electrode 26 can have a relatively high acoustic impedance. The first electrode 26 can include molybdenum (Mo), tungsten (W), ruthenium (Ru), chromium (Cr), iridium (Ir), platinum (Pt), Ir/Pt, nickel (Ni), cobalt (Co), or any suitable alloy and/or combination thereof. Similarly, the second electrode 28 can have a relatively high acoustic impedance. The second electrode 28 can include Mo, W, Ru, Cr, Ir, Pt, Ir/Pt, Ni, Co, or any suitable alloy and/or combination thereof. The second electrode 28 can be formed of the same material as the first electrode 26 in certain instances. The second electrode 28 can be referred to as an upper electrode. The thickness of the first electrode 26 can be approximately the same as the thickness of the second electrode 28 in the electrode and piezoelectric stack 15. The first electrode 26 and the second electrode 28 can be the only electrodes of the BAW device 10.

Other embodiments of piezoelectric and electrode stacks of BAW devices with a plurality of stacked piezoelectric layers that include at least one piezoelectric layer formed by ALD will be discussed with reference to example cross sections shown in FIGS. 4 to 13B. These electrode and piezoelectric stacks can be implemented in place of the electrode and piezoelectric stack 15 of FIGS. 1 and 3. These electrode and piezoelectric stacks can be implemented in any other suitable BAW device. A piezoelectric stack positioned between electrodes can include any suitable combination of piezoelectric layers formed by ALD and another method such as sputtering. Any suitable combination of features of the electrode and piezoelectric stacks of FIGS. 3 to 13B can be combined with each other.

Figure 4:
FIG. 4 is a cross sectional schematic diagram of a portion of a BAW device with a plurality of stacked piezoelectric layers positioned between electrodes according to another embodiment.
Figure 4:
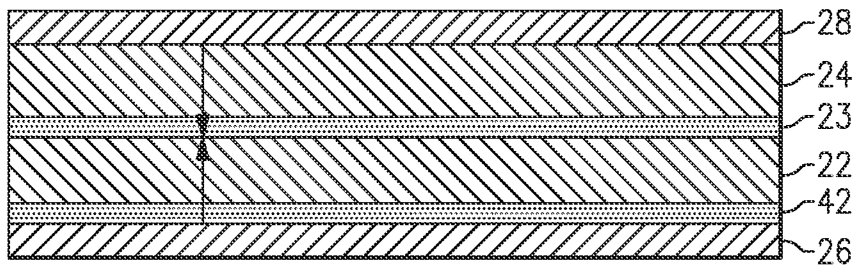

FIG. 4 is a cross sectional schematic diagram of an electrode and piezoelectric stack 40 according to an embodiment. The electrode and piezoelectric stack 40 is like the electrode and piezoelectric stack 15 of FIG. 3, except that an additional piezoelectric layer 42 formed by ALD is included in the electrode and piezoelectric stack 40. The piezoelectric layer 42 is directly over the first electrode 26 in FIG. 4. The ALD formed piezoelectric layer 42 can control polarization of the piezoelectric layer 22 formed directly over the piezoelectric layer 42. The piezoelectric layer 22 can be formed by sputtering. The first piezoelectric layer 42 formed by ALD and the first piezoelectric layer 22 have the same polarization in the electrode and piezoelectric stack 40. The electrode and piezoelectric stack 40 stack is configured to excite a second harmonic mode as a main mode. In an embodiment, the piezoelectric layer 42 is an AlN layer with N-type polarization formed by ALD, the piezoelectric layer 22 is an AlN layer with N-type polarization formed by sputtering, the piezoelectric layer 23 is an AlN layer with Al-type polarization formed by ALD, and the piezoelectric layer 24 is an AlN layer with Al-type polarization formed by sputtering.

Figure 5:
FIG. 5 is a cross sectional schematic diagram of a portion of a BAW device with a plurality of stacked piezoelectric layers formed by ALD between electrodes according to an embodiment.
Figure 5:
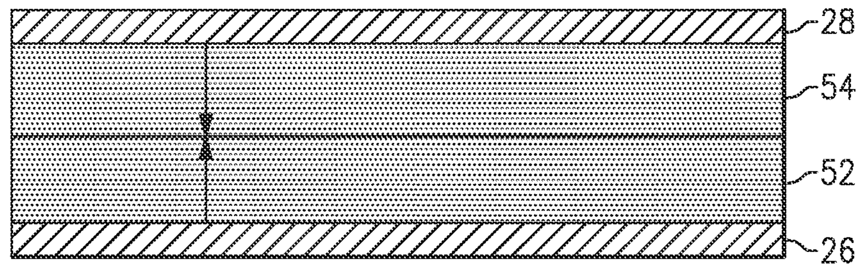

FIG. 5 is a cross sectional schematic diagram of an electrode and piezoelectric stack 50 according to an embodiment. The electrode and piezoelectric 50 is an example where all of the stacked piezoelectric layers are formed by ALD. Using ALD to form each piezoelectric layer of a stack of piezoelectric layers, the polarization of each piezoelectric layer can be controlled by the sequence of ALD cycles. In the electrode and piezoelectric stack 50, piezoelectric layers 52 and 54 have opposite polarizations and are each formed by ALD. The electrode and piezoelectric stack 50 can be suitable for high frequency applications where a BAW device has a high resonant frequency and/or with thin piezoelectric layers. The piezoelectric layers of the electrode and piezoelectric stack 50 can be formed in a single ALD machine in certain applications.

In certain applications, the piezoelectric layers 52 and 54 can each be thicker than other piezoelectric layers formed by ALD disclosed herein that have a sputtered piezoelectric layer directly thereover. To form a thicker piezoelectric layer by ALD, more ALD cycles can be performed. In an embodiment, the piezoelectric layer 52 is an AlN layer with N-type polarization formed by ALD and the piezoelectric layer 52 is an AlN layer with Al-type polarization formed by ALD.

Figure 6:
FIG. 6 is a cross sectional schematic diagram of a portion of a BAW device with a plurality of stacked piezoelectric layers according to another embodiment.
Figure 6:
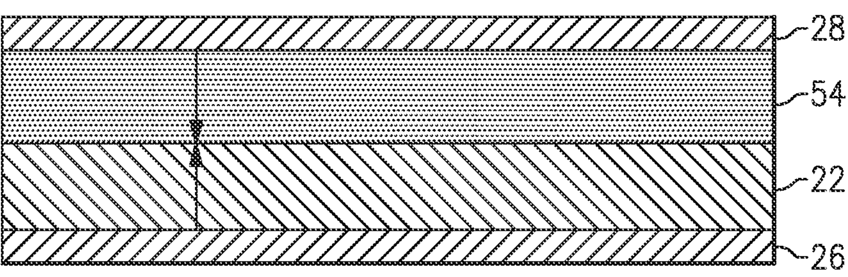

FIG. 6 is a cross sectional schematic diagram of an electrode and piezoelectric stack 60 according to an embodiment. In the electrode and piezoelectric stack 60, a first piezoelectric layer 22 can be formed by sputtering and a second piezoelectric layer 54 is formed by ALD directly over the first piezoelectric layer 22. The first and second piezoelectric layers 22 and 54, respectively, have opposite polarizations. The second piezoelectric layer 54 can be approximately the same thickness as the first piezoelectric layer 22. The electrode and piezoelectric stack 60 can excite a second harmonic mode as a main mode. In an embodiment, the piezoelectric layer 22 is an AlN layer with N-type polarization formed by sputtering and the piezoelectric layer 54 is an AlN layer with Al-type polarization formed by ALD.

Although FIG. 6 illustrates a single piezoelectric layer formed by ALD over a piezoelectric layer formed by sputtering, a piezoelectric stack can include two or more piezoelectric layers formed by ALD having alternating polarizations formed by ALD over a piezoelectric layer formed by sputtering in some embodiments.

Figure 7:
FIG. 7 is a cross sectional schematic diagram of a portion of a BAW device with a plurality of stacked piezoelectric layers according to another embodiment.
Figure 7:
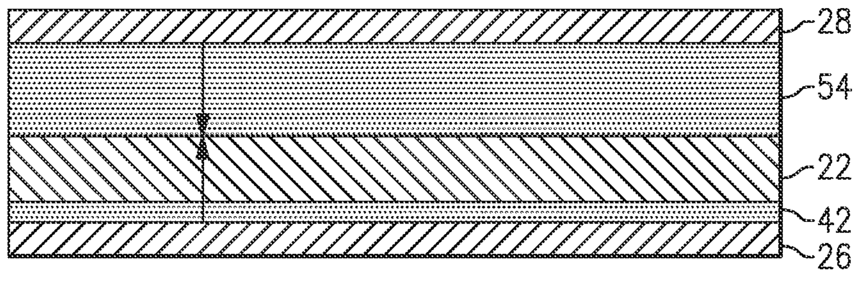

FIG. 7 is a cross sectional schematic diagram of an electrode and piezoelectric stack 70 according to an embodiment. In the electrode and piezoelectric stack 70, a piezoelectric layer 42 is formed by ALD, a piezoelectric layer 22 can be formed by sputtering directly over the piezoelectric layer 42, and a piezoelectric layer 54 is formed by ALD directly over the piezoelectric layer 22. The piezoelectric layer 42 can be a relatively thin layer that sets a polarization of the piezoelectric layer 22. The piezoelectric layer 54 inverts the polarization in the electrode and piezoelectric stack 70. ALD cycles can be repeated until the piezoelectric layer 54 has a desired thickness. The electrode and piezoelectric stack 70 can excite a second harmonic mode as a main mode. In an embodiment, the piezoelectric layer 42 is an AlN layer with N-type polarization formed by ALD, the piezoelectric layer 22 is an AlN layer with N-type polarization formed by sputtering, and the piezoelectric layer 54 is an AlN layer with Al-type polarization formed by ALD.

Figure 8:
FIG. 8 is a cross sectional schematic diagram of a portion of a BAW device with a plurality of stacked piezoelectric layers according to another embodiment.
Figure 8:
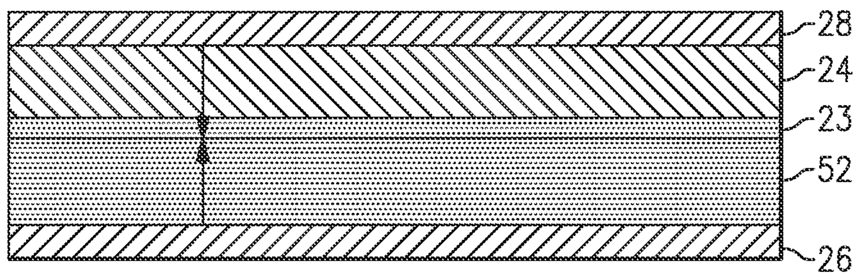

FIG. 8 is a cross sectional schematic diagram of an electrode and piezoelectric stack 80 according to an embodiment. In the electrode and piezoelectric stack 80, a piezoelectric layer 52 is formed by ALD, a piezoelectric layer 23 is formed directly over the piezoelectric layer 42 by ALD, and a piezoelectric layer 24 can be formed directly over the piezoelectric layer 23 by sputtering. The piezoelectric layer 23 can be a relatively thin layer that inverts polarization in the piezoelectric stack and sets a polarization of the piezoelectric layer 24. The electrode and piezoelectric stack 80 can excite a second harmonic mode as a main mode. In an embodiment, the piezoelectric layer 52 is an AlN layer with N-type polarization formed by ALD, the piezoelectric layer 23 is an AlN layer with Al-type polarization formed by ALD, and the piezoelectric layer 24 is an AlN layer with Al-type polarization formed by sputtering.

BAW devices with electrode and piezoelectric stacks of FIGS. 3 to 8 can excite a second harmonic mode as a main mode. Any suitable principles and advantages disclosed herein can be applied to a BAW device that is arranged to excite a third harmonic mode, a fourth harmonic mode, a fifth harmonic mode, or a higher harmonic mode as a main mode. Such BAW devices can excite a harmonic mode with a resonant frequency in a range from 5 GHz to 40 GHz, for example.

Figure 9:
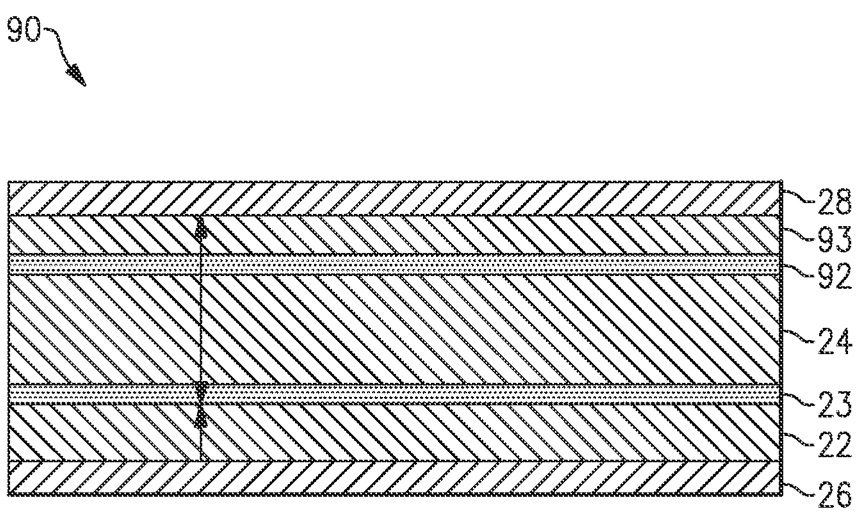
FIG. 9 is a cross sectional schematic diagram of a portion of a BAW device with a plurality of stacked piezoelectric layers configured to excite a third harmonic mode according to an embodiment.

FIG. 9 is a cross sectional schematic diagram of an electrode and piezoelectric stack 90 according to an embodiment. In the electrode and piezoelectric stack 90, a plurality of stacked piezoelectric layers includes alternating piezoelectric layers formed by ALD and piezoelectric layers that can be formed by sputtering. As illustrated in FIG. 9, the plurality of stacked piezoelectric layers includes a first piezoelectric layer 22 that can be formed by sputtering, a first piezoelectric layer 23 formed by ALD, a second piezoelectric layer 24 that can be formed by sputtering, a second piezoelectric layer 92 formed by ALD, and a third piezoelectric layer 93 that can be formed by sputtering. The piezoelectric layers 23 and 92 formed by ALD invert polarization of the piezoelectric stack of the electrode and piezoelectric stack 90. The piezoelectric layers 24 and 93 have the same polarization as a piezoelectric layer formed by ALD directly thereunder. The electrode and piezoelectric stack 90 can excite a third harmonic mode as a main mode. The third harmonic mode has a resonant frequency that can be about 3 times a resonant frequency of a fundamental mode of a BAW device. The resonant frequency for the third harmonic mode may not be exactly 3 times a resonant frequency of the fundamental mode, for example, due to contributions of the electrodes 26 and 28 of the BAW device to resonant frequency. In an embodiment, the piezoelectric layer 22 is an AlN layer with N-type polarization formed by sputtering, the piezoelectric layer 23 is an AlN layer with Al-type polarization formed by ALD, the piezoelectric layer 24 is an AlN layer with Al-type polarization formed by sputtering, the piezoelectric layer 92 is an AlN layer with N-type polarization formed by ALD, and the piezoelectric layer 93 is an AlN layer with N-type polarization formed by sputtering.

Figure 10:
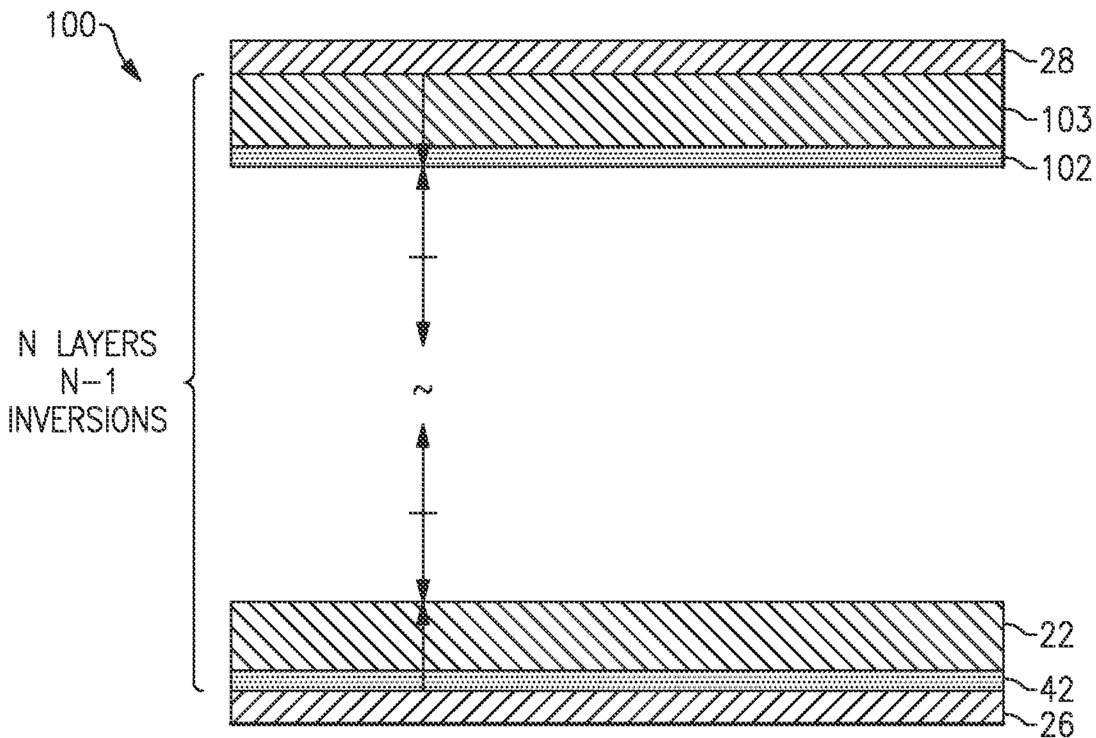
FIG. 10 is a cross sectional schematic diagram of a portion of a BAW device with a plurality of stacked piezoelectric layers with N−1 polarization inversions according to an embodiment.

FIG. 10 is a cross sectional schematic diagram of an electrode and piezoelectric stack 100 according to an embodiment. The principles and advantages of the stacked piezoelectric layers disclosed herein can be applied to excite an n-th harmonic mode as a main mode. With N−1 polarization inversions, the n-th harmonic mode can be excited. There can be N sputtered piezoelectric layers and N piezoelectric layers formed by ALD in such a device. In some other instances, there can be N sputtered piezoelectric layers and N−1 piezoelectric layers formed by ALD where the first piezoelectric layer over a lower electrode is a sputtered.

In the electrode and piezoelectric stack 100, a plurality of stacked piezoelectric layers includes alternating piezoelectric layers formed by atomic layer deposition and piezoelectric layers formed by sputtering. As illustrated in FIG. 10, the plurality of stacked piezoelectric layers includes piezoelectric layers 42 and 102 formed by ALD and piezoelectric layers 22 and 103 formed by sputtering. Piezoelectric layers formed by ALD can create the N−1 polarization inversions in the electrode and piezoelectric stack 100. The piezoelectric layers formed by sputtering have the same polarization as a piezoelectric layer formed by ALD directly thereunder. The electrode and piezoelectric stack 100 can excite an n-th harmonic mode as a main mode. The n-th harmonic mode has a resonant frequency that can be about N times a resonant frequency of a fundamental mode of the BAW device, where N is a positive integer greater than 2.

Any of the piezoelectric layers formed by sputtering disclosed herein can be doped. Piezoelectric layers formed by ALD can be doped. Doping a piezoelectric can increase the coupling coefficient $k^2$ of a BAW device. Doping to increase the coupling coefficient $k^2$ can be advantageous at higher frequencies where the coupling coefficient $k^2$ can be degraded. Doping a piezoelectric layer can adjust resonant frequency of a BAW device. FIG. 11A illustrates an example electrode and piezoelectric stack that includes doped piezoelectric layers formed by sputtering. Including a dopant in a piezoelectric layer can improve the piezoelectric response. As an example, scandium (Sc) can be added to an aluminum nitride film to improve the piezoelectric response.

FIG. 11A is a cross sectional schematic diagram of an electrode and piezoelectric stack 110 according to an embodiment. The electrode and piezoelectric stack 110 is like the piezoelectric stack 15 of FIG. 3, except that sputtered piezoelectric layers 112 and 114 are doped. As illustrated, the electrode and piezoelectric stack 110 includes a first doped piezoelectric layer 112, a piezoelectric 23 formed by ALD, and a second doped piezoelectric layer 114. The piezoelectric layer 23 formed by ALD inverts polarization of the piezoelectric layers in the electrode and piezoelectric stack 110. The piezoelectric layer 23 formed by ALD can be undoped. In some applications, a piezoelectric layer formed by ALD can be doped. For example, a scandium doped aluminum nitride piezoelectric layer can be formed by ALD. A scandium precursor can be used in ALD to form an Al(Sc)N piezoelectric layer.

The doped first piezoelectric layer 122 is formed by sputtering, such as PVD sputtering. The first doped piezoelectric layer 122 can be an AlN layer doped with scandium. The doped first piezoelectric layer 122 can be formed by radio frequency (RF) sputtering from a compound target with a fixed dopant composition. The piezoelectric layer 23 is formed by ALD such that the piezoelectric layer has an opposite polarization relative to the first doped piezoelectric layer 112. The second doped piezoelectric layer 114 is formed by sputtering over the piezoelectric layer 23. By forming the second doped piezoelectric layer 114 by sputtering, the second doped piezoelectric layer 114 can have the same polarization as the piezoelectric layer 23.

The first doped piezoelectric layer 112 can be doped with any suitable dopant, such as a scandium (Sc) based dopant, a magnesium (Mg) based dopant, a calcium (Ca) based dopant, a yttrium (Y) based dopant, a chromium (Cr) based dopant, or the like. Example doped aluminum nitride based piezoelectric films include without limitation Al(Sc)N, Al(ScB)N, Al(MgZr)N, Al(MgTi)N, Al(MgHf)N, Al(MgNb)N, Al(CaSi)N. Al(Y)N, and Al(YB)N.

The second doped piezoelectric layer 114 can be doped with any suitable dopant, such as any of the dopants from the previous paragraph. In certain applications, the first doped piezoelectric layer 112 and the second doped piezoelectric layer 114 can be doped with the same dopant and similar or the same doping concentration. In such applications, the same compound target can be used for sputtering the first doped piezoelectric layer 112 and the second doped piezoelectric layer 114. According to some other applications, the first doped piezoelectric layer 112 and the second doped piezoelectric layer 114 can be doped with different dopants and/or doping concentrations.

FIG. 11B is a cross sectional schematic diagram of an electrode and piezoelectric stack 120 according to an embodiment. The principles and advantages of the stacked piezoelectric layers disclosed herein can be applied to excite an n-th harmonic mode as a main mode where one or more of the sputtered piezoelectric layers are doped. With N−1 polarization inversions, the n-th harmonic mode can be excited. There can be N sputtered doped piezoelectric layers and N−1 piezoelectric layers formed by ALD in such a device. In the electrode and piezoelectric stack 120, a plurality of stacked piezoelectric layers includes alternating doped piezoelectric layers formed by sputtering and piezoelectric layers formed by ALD.

The electrode and piezoelectric stack 120 is like the electrode and piezoelectric stack 100 of FIG. 10, except that (1) the piezoelectric layers 112, 123 formed by sputtering are doped and (2) a piezoelectric layer 112 is formed directly over the first electrode 26. The doped piezoelectric layers 112 and 123 formed by sputtering can be aluminum nitride layers doped with scandium, for example. The doped piezoelectric layers 112 and 123 formed by sputtering can include any suitable piezoelectric material and any suitable dopant (s). The piezoelectric layers in the electrode and piezoelectric stack 120 that are formed by ALD (e.g., the piezoelectric layer 102) can be undoped.

In certain applications, an interposer can be included between stacked piezoelectric layers of a BAW device. An interposer can be included between any two suitable stacked piezoelectric layers of any of the embodiments disclosed herein. Such an interposer can be a metal interposer or a dielectric interposer. The interposer can include metal with relatively high acoustic impedance, such as one or more of ruthenium, tungsten, or molybdenum. The interposer can be a single layer or a multi-layer stack. The interposer can be positioned between a sputtered piezoelectric layer and a piezoelectric layer formed by ALD. For example, during manufacturing, the interposer can be formed over a piezoelectric layer and then another piezoelectric layer can be formed on the interposer by ALD. Example electrode and piezoelectric stacks with an interposer will be discussed with reference to FIGS. 12A and 12B.

Figure 12A:
FIG. 12A is a cross sectional schematic diagram of an electrode and piezoelectric stack that includes an interposer according to an embodiment.
Figure 12A:
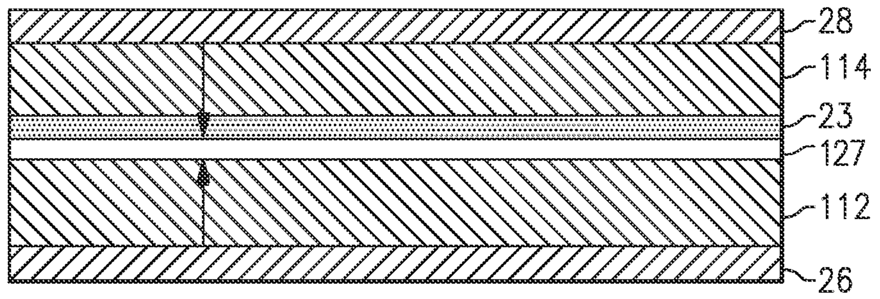

FIG. 12A is a cross sectional schematic diagram of an electrode and piezoelectric stack 125 that includes an interposer 127 according to an embodiment. The electrode and piezoelectric stack 125 is like the electrode and piezoelectric stack 110 of FIG. 11A, except that the interposer 127 is included. As illustrated in FIG. 12A, the interposer 127 is positioned between a first doped piezoelectric layer 112 and a piezoelectric 23 formed by ALD. During manufacture, the interposer 127 can be formed over the first doped piezoelectric layer 112 and then the piezoelectric layer 23 can be over formed by ALD over the interposer 127. The interposer 127 can be a metal interposer. The interposer 127 can include a metal with a relatively high acoustic impedance, such as ruthenium, tungsten, or molybdenum. The interposer 127 can be a single layer. Alternatively, the interposer 127 can include a plurality of layers. In an embodiment, the first doped piezoelectric layer 112 is a scandium doped aluminum nitride layer with N-type polarization formed by sputtering, the interposer 127 is a metal interposer, the piezoelectric 23 formed by ALD is an aluminum nitride piezoelectric layer with Al-type polarization, the second doped piezoelectric layer 114 is a scandium doped aluminum nitride layer with Al-type polarization formed by sputtering.

Figure 12B:
FIG. 12B is a cross sectional schematic diagram of an electrode and piezoelectric stack that includes an interposer according to another embodiment.
Figure 12B:
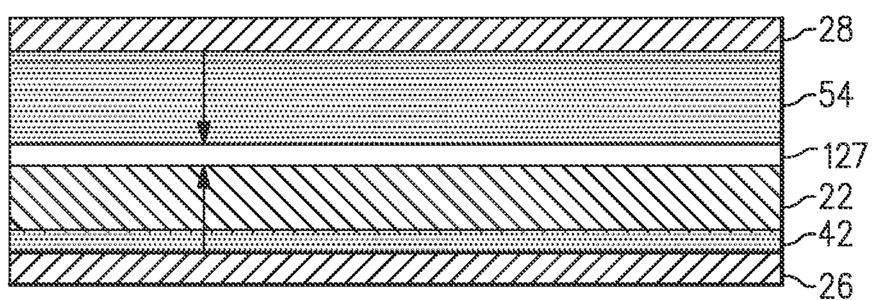

FIG. 12B is a cross sectional schematic diagram of an electrode and piezoelectric stack 128 that includes an interposer 127 according to another embodiment. The electrode and piezoelectric stack 128 is like the electrode and piezoelectric stack piezoelectric stack 70 of FIG. 7, except that the interposer 127 is included. As illustrated in FIG. 12B, the interposer 127 is positioned between a piezoelectric layer 22 and a piezoelectric layer 54 is formed by ALD. During manufacture, the piezoelectric layer 22 can be formed by sputtering, the interposer 127 can be formed over the piezoelectric layer 22, and then the piezoelectric layer 54 can be over formed by ALD over the interposer 127. The interposer 127 can be implemented in accordance with any suitable principles and advantages of the interposers disclosed herein.

Figure 12C:
FIG. 12C is a cross sectional schematic diagram of an electrode and piezoelectric stack that includes an interposer according to another embodiment.
Figure 12C:
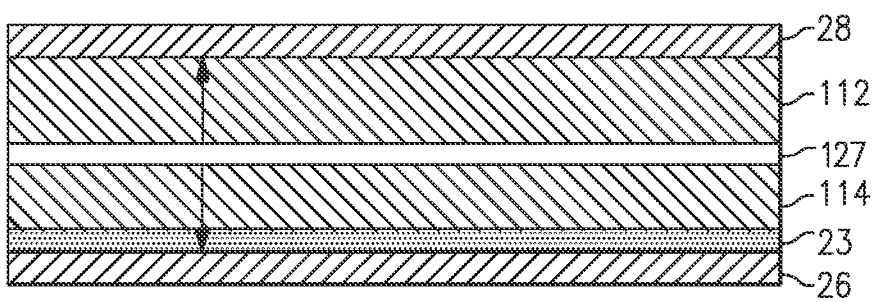

FIG. 12C is a cross sectional schematic diagram of an electrode and piezoelectric stack 129 that includes an interposer 127 according to another embodiment. The electrode and piezoelectric stack 129 includes doped piezoelectric layers. In the electrode and piezoelectric stack 129, a piezoelectric layer that is directly over the bottom electrode has an opposite polarization relative to a piezoelectric layer directly over the bottom electrode of the electrode and piezoelectric stack 125 of FIG. 12A or the electrode or the piezoelectric stack 128 of FIG. 12B. The electrode and piezoelectric stack 129 includes a piezoelectric layer directly over the interposer 127 having an opposite polarization than a piezoelectric layer directly over the interposer 127 in the electrode and piezoelectric stack 125 of FIG. 12A or in the 128 electrode and piezoelectric stack of FIG. 12B.

In the electrode and piezoelectric stack 129, the interposer 127 can be positioned between two piezoelectric layers having opposite polarizations and formed by the same type of process, such as sputtering. During manufacture, the piezoelectric layer 23 can be formed by ALD over the bottom electrode 26 and the second doped piezoelectric layer 114 can be formed over the piezoelectric layer 23 formed by ALD such that these two piezoelectric layers have a same polarization. The interposer 127 can be formed over the second doped piezoelectric layer 114. Then the first doped piezoelectric layer 112 can be formed over the interposer 127 such that the first doped piezoelectric layer 112 has an opposite polarization than the second doped piezoelectric layer 114. In this case, the interposer 127 can invert polarization of piezoelectric layers in the electrode and piezoelectric stack 129.

In an embodiment of FIG. 12C, the piezoelectric 23 formed by ALD is an aluminum nitride piezoelectric layer with Al-type polarization, the second doped piezoelectric layer 114 is a scandium doped aluminum nitride layer with Al-type polarization formed by sputtering, the interposer is a metal interposer, and the first doped piezoelectric layer 112 is a scandium doped aluminum nitride layer with N-type polarization formed by sputtering.

BAW devices in accordance with principles and advantages disclosed herein can have a main mode with a relatively high resonant frequency. Such a resonant frequency can be in a range from 10 gigahertz to 20 gigahertz, 20 gigahertz to 30 gigahertz, 24 gigahertz to 30 gigahertz, or 10 gigahertz to 40 gigahertz.

Any suitable principles and advantages disclosed herein can be implemented in a stacked BAW resonator with piezoelectric layers of opposite polarization. Such a BAW resonator can be a stacked resonator that includes two FBARs with c-axes oriented in opposite directions. Such a BAW resonator can be driven from a center electrode between FBAR stacks and also include grounded electrodes on the top and bottom of the stack.

Figure 13A:
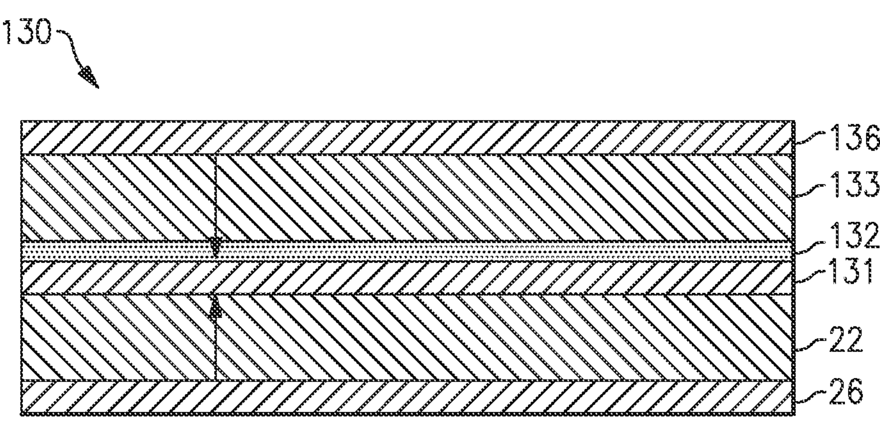
FIG. 13A is a cross sectional schematic diagram of a portion of a stacked BAW resonator with piezoelectric layers of opposite polarization according to an embodiment.

FIG. 13A is a cross sectional schematic diagram of an electrode and piezoelectric stack 130 according to an embodiment. The electrode and piezoelectric stack 130 can implement a reversed c-axis bulk acoustic resonator. The reversed c-axis bulk acoustic wave resonator can have about one quarter the area of a similar FBAR. In a reversed c-axis bulk acoustic wave resonator, the top and bottom piezoelectric layers have opposite or reversed polarizations. The electrode and piezoelectric stack 130 can be used in applications for filtering radio frequency signals with relatively low frequencies for wireless communications (e.g., frequencies in a range from 300 MHz to 500 MHz).

The electrode and piezoelectric stack 130 includes a grounded lower electrode 26, a drive electrode 131, and a grounded upper electrode 136. In the electrode and piezoelectric stack 130, piezoelectric layer 22 is positioned between the grounded lower electrode 26 and the drive electrode 131. Piezoelectric layers 132 and 133 are stacked with each other and positioned between the drive electrode 131 and the grounded upper electrode 136. Any of the sputtered piezoelectric layers of the electrode and piezoelectric stack 130 can be doped in certain applications.

The piezoelectric layer 132 is formed over the drive electrode 131 by ALD. The piezoelectric layer 132 can be an AlN layer. The piezoelectric layer 132 has an opposite polarization than the piezoelectric layer 22. The piezoelectric layer 132 can invert the c-axis of piezoelectric layers 132 and 133 over the drive electrode 131 relative the piezoelectric layer 22 under the drive electrode 131. The piezoelectric layer 133 can be formed over the piezoelectric layer 132 by sputtering. The piezoelectric layers 132 and 133 have c-axes oriented in the same direction.

Figure 13B:
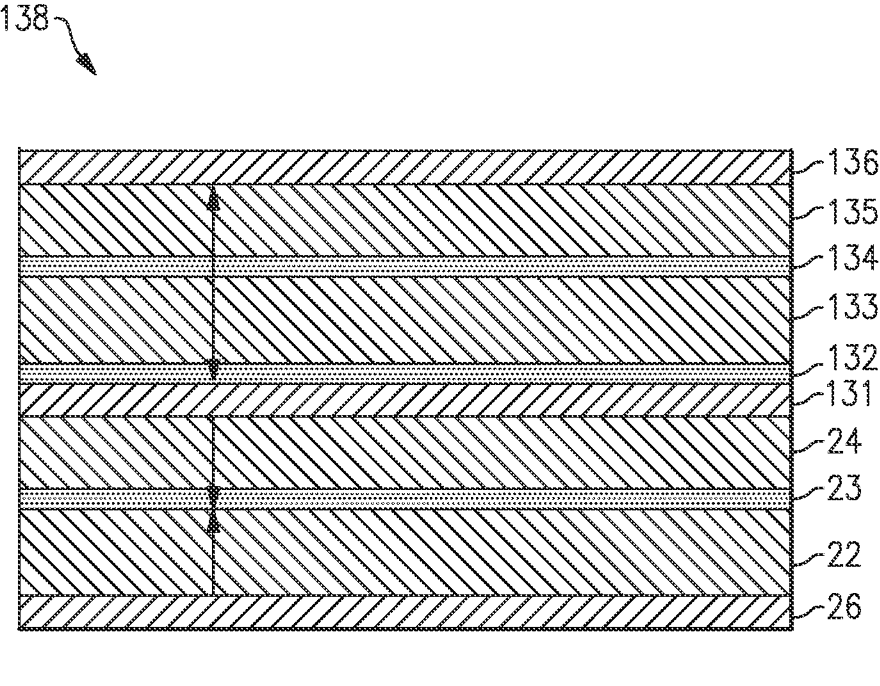
FIG. 13B is a cross sectional schematic diagram of a portion of a stacked BAW resonator with piezoelectric layer stacks of different polarizations according to an embodiment.

FIG. 13B is a cross sectional schematic diagram of an electrode and piezoelectric stack 138 according to an embodiment. The electrode and piezoelectric stack 138 includes two piezoelectric layer stacks on opposing sides of the drive electrode 131, where each of the piezoelectric layer stacks includes a polarization inversion. In the electrode and piezoelectric stack 138, piezoelectric layers 22, 23, and 24 are stacked with each other and positioned between the grounded lower electrode 26 and the drive electrode 131. Piezoelectric layers 132, 133, 134, and 135 are stacked with each other and positioned between the drive electrode 131 and grounded upper electrode 136. Any of the sputtered piezoelectric layers of the electrode and piezoelectric stack 130 can be doped in certain applications.

The piezoelectric layer 132 is formed over the drive electrode 131 by ALD. The piezoelectric layer 132 can be an AlN layer. The piezoelectric layer 132 has the same orientation as the piezoelectric layer 24. The piezoelectric layer 133 is formed over the piezoelectric layer 132 by sputtering. The piezoelectric layers 132 and 133 have c-axes oriented in the same direction. The piezoelectric layer 134 is formed over the piezoelectric layer 133 by ALD. The piezoelectric layers 133 and 134 have c-axes oriented in opposite directions. The piezoelectric layer 135 is formed over the piezoelectric layer by sputtering. The piezoelectric layers 134 and 135 have c-axes oriented in the same direction.

Aspects of this disclosure relate to methods of manufacturing BAW devices with polarization inversion in a piezoelectric stack. One or more piezoelectric layers in the piezoelectric stack can be formed by ALD to invert polarization. Examples methods are discussed with reference to FIGS. 14 and 15. Methods disclosed herein can be used to manufacture any suitable electrode and piezoelectric stack disclosed herein. BAW devices manufactured by methods disclosed herein can achieve relatively high frequencies and provide desirable mechanical stability and/or power handling. Any suitable principles and advantages of the methods of manufacturing BAW devices disclosed herein can be implemented together with each other.

Figure 14:
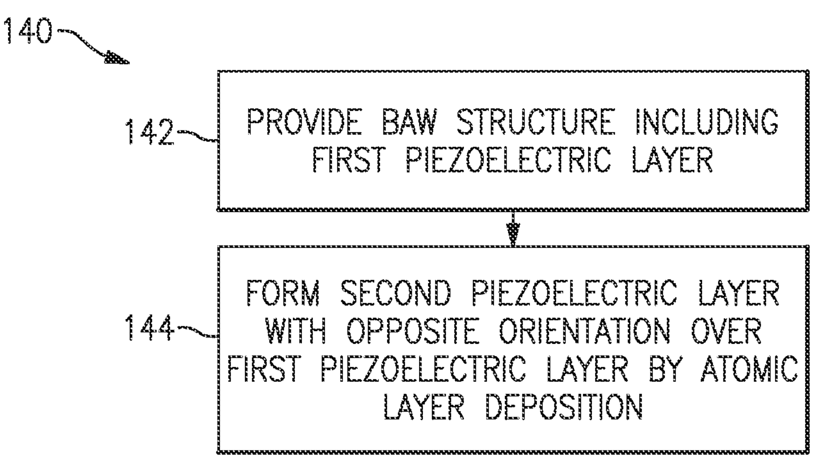
FIG. 14 is a flow diagram of an example method of manufacturing a BAW device according to an embodiment.

FIG. 14 is a flow diagram of an example method 140 of manufacturing a BAW device according to an embodiment. At block 142, a BAW structure including a first piezoelectric layer is provided. The BAW structure is part of an unfinished BAW device. The BAW device structure can include a support substrate, an acoustic reflector (e.g., an air cavity) over the support substrate, a first electrode and the first piezoelectric layer. The BAW device structure can include one or more other piezoelectric layers stacked with the first piezoelectric layer. The first piezoelectric layer can include aluminum nitride. The first piezoelectric layer can be doped. The first piezoelectric layer can be formed by sputtering.

At block 144, a second piezoelectric layer is formed over the first piezoelectric layer by ALD. The second piezoelectric layer has an opposite orientation relative to the first piezoelectric layer. The opposite orientation can be an opposite polarization. The second piezoelectric layer inverts polarization in the piezoelectric layer stack.

In certain applications, an oxygen source can be included in vapor for ALD of the second piezoelectric layer. For example, an oxygen source can be added to the gases of an ALD Al(Sc)N film deposition. Including an oxygen source in vapor for ALD of an aluminum nitride piezoelectric film can invert aluminum nitride polarization. With an oxygen source in gas for ALD of an aluminum nitride piezoelectric layer, there can be an aluminum nitride film with oxygen (Al(O)N) in a polarization initiation zone of the aluminum nitride piezoelectric layer.

One or more other piezoelectric layers can be formed over and stacked with the second piezoelectric layer. The one or more other piezoelectric layers can be formed by sputtering and/or ALD. With additional polarization inversions in the piezoelectric stack, a higher order harmonic mode with a higher frequency can be a main mode of the BAW device.

Figure 15:
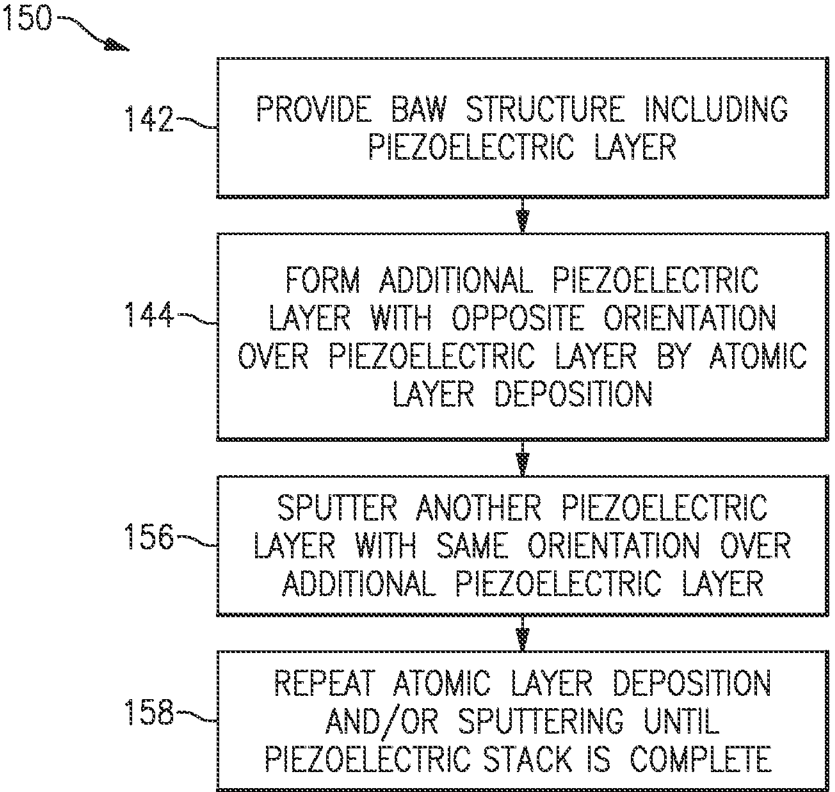
FIG. 15 is a flow diagram of an example method of manufacturing a BAW device according to an embodiment.

FIG. 15 is a flow diagram of an example method 150 of manufacturing a BAW device according to an embodiment. The method 150 involves forming a plurality of stacked piezoelectric layers with polarization inversion. At block 142, a BAW structure with a piezoelectric layer is provided. An additional piezoelectric layer is formed over the piezoelectric layer by ALD at block 144. The additional piezoelectric layer and the piezoelectric layer have opposite orientations. Another piezoelectric layer is formed over the additional piezoelectric layer by sputtering at block 156. These piezoelectric layers have the same orientation as each other. One or more other piezoelectric layers can be formed in the stack by ALD and/or sputtering until the piezoelectric stack is complete at block 158. Then an electrode can be formed over the piezoelectric stack so that the piezoelectric stack is positioned between a pair of electrodes.

Figure 16:
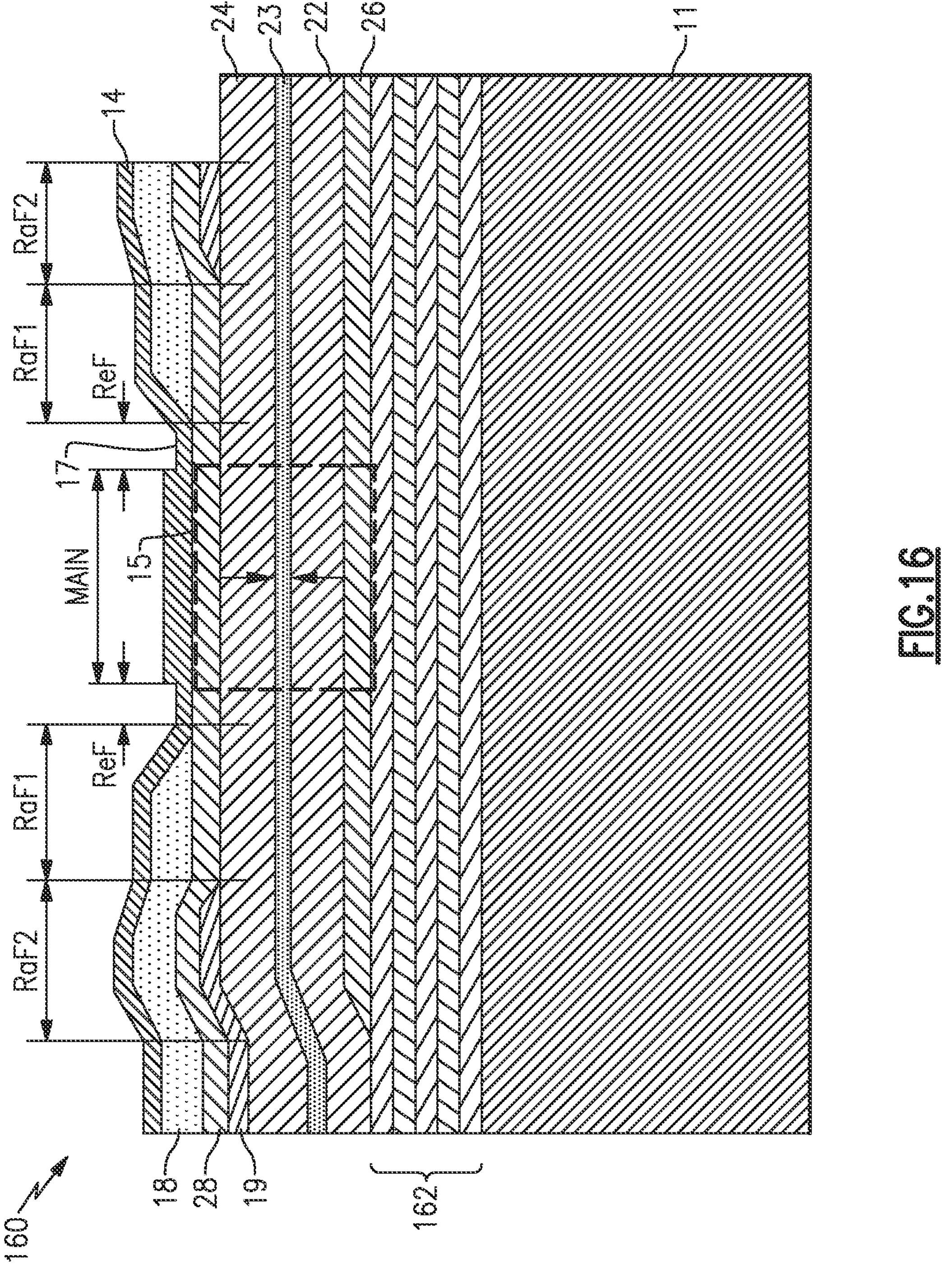
FIG. 16 is a cross sectional schematic diagram of a solidly mounted BAW resonator with a plurality of stacked piezoelectric layers between electrodes according to an embodiment.

FIG. 16 is a cross sectional schematic diagram of a BAW device 160 according to an embodiment. The BAW device 160 is like the BAW device 10 of FIG. 1 except that a solid acoustic mirror 162 is included in place of an air cavity 12. The solid acoustic mirror 162 is an acoustic Bragg reflector. The solid acoustic mirror 162 includes alternating low acoustic impedance and high acoustic impedance layers. As one example, the solid acoustic mirror 162 can include alternating silicon dioxide layers as low impedance layers and tungsten layers as high impedance layers. The BAW device 160 is an example of a solidly mounted resonator (SMR) BAW device. Any suitable principles and advantages of disclosed herein can be applied in SMR BAW devices. The BAW device 160 can be a type II BAW device.

BAW devices disclosed herein can be implemented as BAW resonators in in acoustic wave filters. Such filters can be arranged to filter a radio frequency signal. In certain applications, the acoustic wave filters can be band pass filters arranged to pass a radio frequency band and attenuate frequencies outside of the radio frequency band. Acoustic wave filters can implement band rejection filters. Bulk acoustic wave devices disclosed herein can be implemented in a variety of different filter topologies. Example filter topologies include a ladder filter, a lattice filter, and a hybrid ladder lattice filter, and the like. An acoustic wave filter can include all BAW resonators or one or more BAW resonators and one or more other types of acoustic wave resonators such as a SAW resonator. BAW resonators disclosed herein can be implemented in a filter that includes at least one BAW resonator and a non-acoustic inductor-capacitor component. Some example filter topologies will now be discussed with reference to FIG. 17 to 19. Any suitable combination of features of the filter topologies of FIGS. 17 to 19 can be implemented together with each other and/or with other filter topologies.

Figure 17:
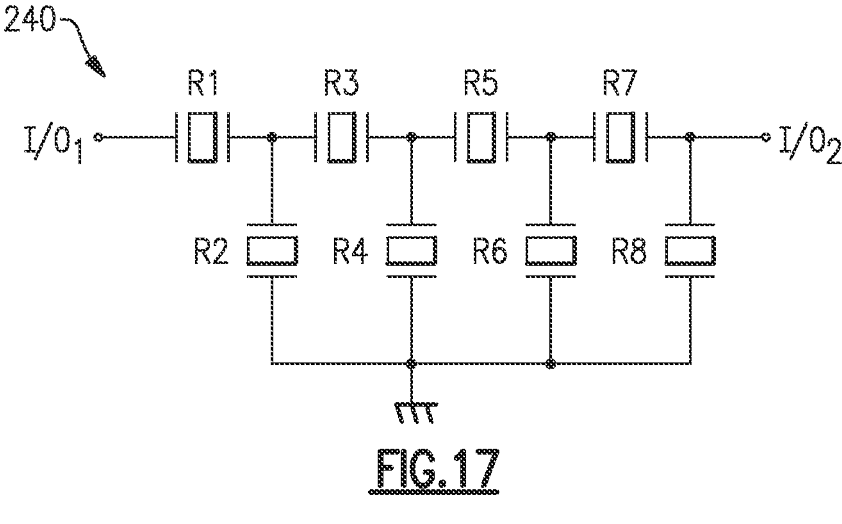
FIG. 17 is a schematic diagram of a ladder filter that includes a bulk acoustic wave resonator according to an embodiment.

FIG. 17 is a schematic diagram of a ladder filter 240 that includes a bulk acoustic wave resonator according to an embodiment. The ladder filter 240 is an example topology that can implement a band pass filter formed from acoustic wave resonators. In a band pass filter with a ladder filter topology, the shunt resonators can have lower resonant frequencies than the series resonators. The ladder filter 240 can be arranged to filter a radio frequency signal. As illustrated, the ladder filter 240 includes series acoustic wave resonators R1, R3, R5, and R7 and shunt acoustic wave resonators R2, R4, R6, and R8 coupled between a first input/output port $I/O_1$ and a second input/output port $I/O_2$. Any suitable number of series acoustic wave resonators can be in included in a ladder filter. Any suitable number of shunt acoustic wave resonators can be included in a ladder filter. The first input/output port $I/O_1$ can a transmit port and the second input/output port $I/O_2$ can be an antenna port. Alternatively, first input/output port $I/O_1$ can be a receive port and the second input/output port $I/O_2$ can be an antenna port.

One or more of the acoustic wave resonators of the ladder filter 240 can include a bulk acoustic wave filter according to an embodiment. For example, some or all of the acoustic wave resonators R1 to R8 can have stacked piezoelectric layers with one or more piezoelectric layers formed by ALD that invert a c-axis orientation. Such acoustic wave resonator (s) can have a high frequency for a main mode and also provide desirable mechanical stability and/or power ruggedness.

Figure 18:
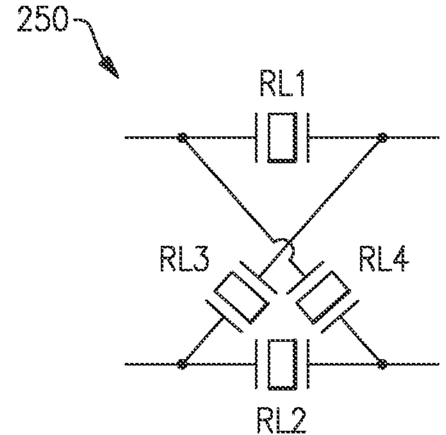
FIG. 18 is a schematic diagram of a lattice filter that includes a bulk acoustic wave resonator according to an embodiment.

FIG. 18 is a schematic diagram of a lattice filter 250 that includes a bulk acoustic wave resonator according to an embodiment. The lattice filter 250 is an example topology that can form a band pass filter from acoustic wave resonators. The lattice filter 250 can be arranged to filter an RF signal. As illustrated, the lattice filter 250 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 250 has a balanced input and a balanced output. One or more of the illustrated acoustic wave resonators RL1 to RL4 can be a bulk acoustic wave resonator in accordance with any suitable principles and advantages disclosed herein.

Figure 19:
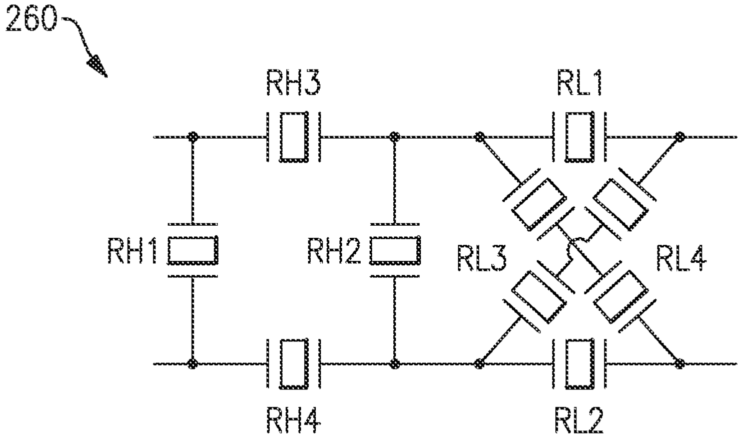
FIG. 19 is a schematic diagram of a hybrid ladder lattice filter that includes a bulk acoustic wave resonator according to an embodiment.

FIG. 19 is a schematic diagram of a hybrid ladder and lattice filter 260 that includes a bulk acoustic wave resonator according to an embodiment. The illustrated hybrid ladder and lattice filter 260 includes series acoustic resonators RL1, RL2, RH3, and RH4 and shunt acoustic resonators RL3, RL4, RH1, and RH2. The hybrid ladder and lattice filter 260 includes one or more bulk acoustic wave resonators in accordance with any suitable principles and advantages disclosed herein.

In some applications, a bulk acoustic wave resonator can be included in filter that also includes one or more inductors and one or more capacitors.

The principles and advantages disclosed herein can be implemented in a standalone filter and/or in one or more filters in any suitable multiplexer. Such filters can be any suitable topology discussed herein, such as any filter topology in accordance with any suitable principles and advantages disclosed with reference to FIG. 17. The filter can be a band pass filter arranged to filter a fourth generation (4G) Long Term Evolution (LTE) band and/or a fifth generation (5G) New Radio (NR) band. Examples of a standalone filter and multiplexers will be discussed with reference to FIGS. 20A to 20E. Any suitable principles and advantages of these filters and/or multiplexers can be implemented together with each other. Moreover, the bulk acoustic wave resonators disclosed herein can be included in filter that also includes one or more inductors and one or more capacitors.

Figure 20A:
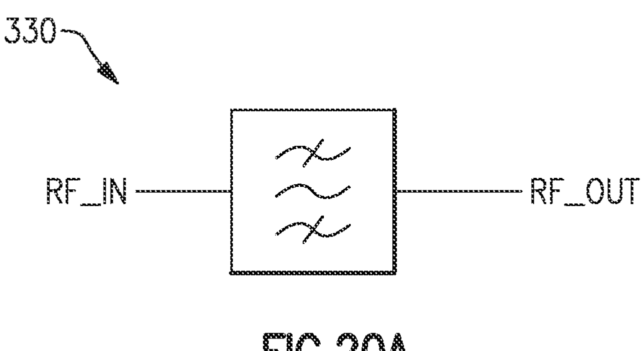
FIG. 20A is schematic diagram of an acoustic wave filter.

FIG. 20A is schematic diagram of an acoustic wave filter 330. The acoustic wave filter 330 is a band pass filter. The acoustic wave filter 330 is arranged to filter a radio frequency signal. The acoustic wave filter 330 includes a plurality of acoustic wave resonators coupled between a first input/output port RF_IN and a second input/output port RF_OUT. The acoustic wave filter 330 includes one or more BAW resonators implemented in accordance with any suitable principles and advantages disclosed herein.

Figure 20B:
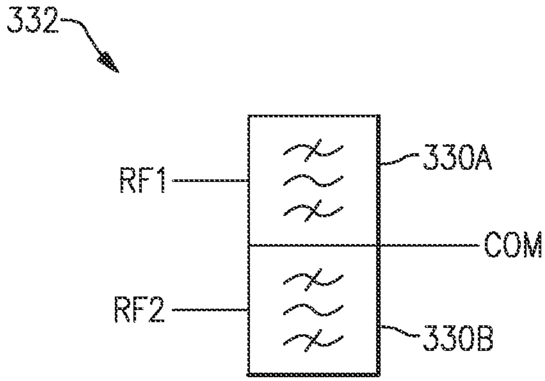
FIG. 20B is a schematic diagram of a duplexer that includes an acoustic wave filter according to an embodiment.

FIG. 20B is a schematic diagram of a duplexer 332 that includes an acoustic wave filter according to an embodiment. The duplexer 332 includes a first filter 330A and a second filter 330B coupled to together at a common node COM. One of the filters of the duplexer 332 can be a transmit filter and the other of the filters of the duplexer 332 can be a receive filter. In some other instances, such as in a diversity receive application, the duplexer 332 can include two receive filters. Alternatively, the duplexer 332 can include two transmit filters. The common node COM can be an antenna node.

The first filter 330A is an acoustic wave filter arranged to filter a radio frequency signal. The first filter 330A includes acoustic wave resonators coupled between a first radio frequency node RF1 and the common node COM. The first radio frequency node RF1 can be a transmit node or a receive node. The first filter 330A includes one or more BAW resonators implemented in accordance with any suitable principles and advantages disclosed herein.

The second filter 330B can be any suitable filter arranged to filter a second radio frequency signal. The second filter 330B can be, for example, an acoustic wave filter, an acoustic wave filter that includes one or more BAW resonators in accordance with any suitable principles and advantages disclosed herein, an LC filter, a hybrid acoustic wave LC filter, or the like. The second filter 330B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of BAW resonators in accordance with any suitable principles and advantages disclosed herein.

Figure 20C:
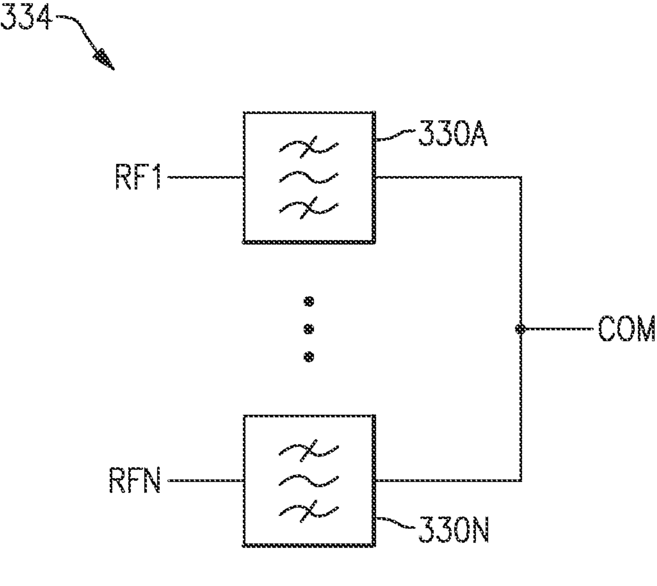
FIG. 20C is a schematic diagram of a multiplexer that includes an acoustic wave filter according to an embodiment.

FIG. 20C is a schematic diagram of a multiplexer 334 that includes an acoustic wave filter according to an embodiment. The multiplexer 334 includes a plurality of filters 330A to 330N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 330A to 330N each have a fixed electrical connection to the common node COM. This can be referred to as hard multiplexing or fixed multiplexing. Filters have fixed electrical connections to the common node in hard multiplexing applications. Each of the filters 330A to 330N has a respective input/output node RF1 to RFN.

The first filter 330A is an acoustic wave filter arranged to filter a radio frequency signal. The first filter 330A can include one or more acoustic wave devices coupled between a first radio frequency node RF1 and the common node COM. The first radio frequency node RF1 can be a transmit node or a receive node. The first filter 330A includes one or more BAW resonators in accordance with any suitable principles and advantages disclosed herein. The other filter (s) of the multiplexer 334 can include one or more acoustic wave filters, one or more acoustic wave filters that include one or more BAW resonators in accordance with any suitable principles and advantages disclosed herein, one or more LC filters, one or more hybrid acoustic wave LC filters, or any suitable combination thereof.

Figure 20D:
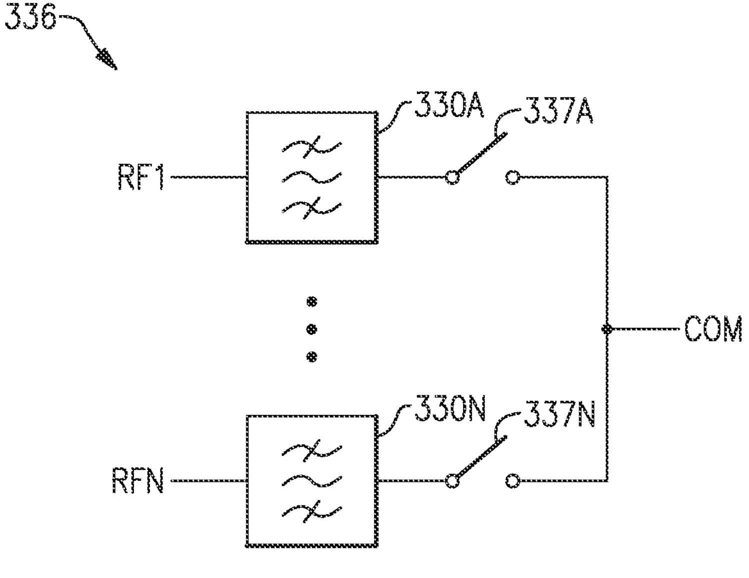
FIG. 20D is a schematic diagram of a multiplexer that includes an acoustic wave filter according to an embodiment.

FIG. 20D is a schematic diagram of a multiplexer 336 that includes an acoustic wave filter according to an embodiment. The multiplexer 336 is like the multiplexer 334 of FIG. 20C, except that the multiplexer 336 implements switched multiplexing. In switched multiplexing, a filter is coupled to a common node via a switch. In the multiplexer 336, the switches 337A to 337N can selectively electrically connect respective filters 330A to 330N to the common node COM. For example, the switch 337A can selectively electrically connect the first filter 330A to the common node COM via the switch 337A. Any suitable number of the switches 337A to 337N can electrically a respective filters 330A to 330N to the common node COM in a given state. Similarly, any suitable number of the switches 337A to 337N can electrically isolate a respective filter 330A to 330N to the common node COM in a given state. The functionality of the switches 337A to 337N can support various carrier aggregations.

Figure 20E:
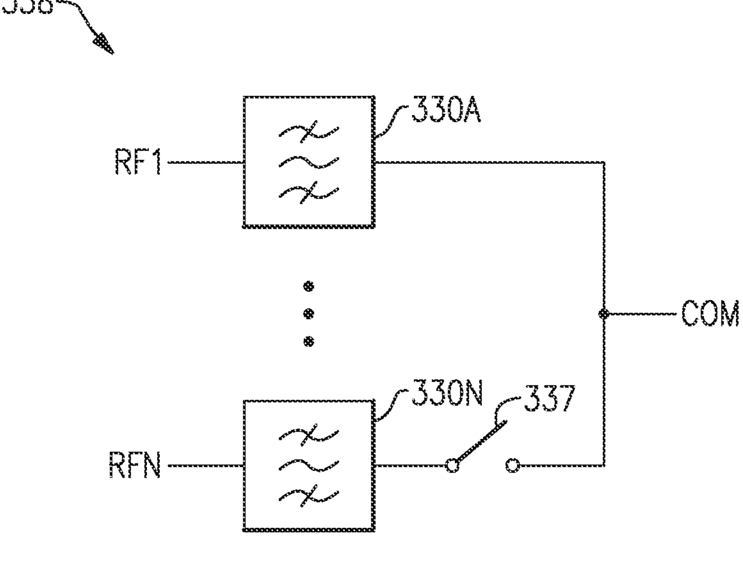
FIG. 20E is a schematic diagram of a multiplexer that includes an acoustic wave filter according to an embodiment.

FIG. 20E is a schematic diagram of a multiplexer 338 that includes an acoustic wave filter according to an embodiment. The multiplexer 338 illustrates that a multiplexer can include any suitable combination of hard multiplexed and switched multiplexed filters. One or more BAW resonators in accordance with any suitable principles and advantages disclosed herein can be included in a filter that is hard multiplexed to the common node of a multiplexer. Alternatively or additionally, one or more BAW resonators in accordance with any suitable principles and advantages disclosed herein can be included in a filter that is switch multiplexed to the common node of a multiplexer.

BAW resonators disclosed herein can be implemented in a variety of packaged modules. Some example packaged modules will now be discussed in which any suitable principles and advantages of the BAW devices disclosed herein can be implemented. Example packaged modules include one or more acoustic wave filters and one or more radio frequency amplifiers (e.g., one or more power amplifiers and/or one or more low noise amplifiers) and/or one or more radio frequency switches. The example packaged modules can include a package that encloses the illustrated circuit elements. The illustrated circuit elements can be disposed on a common packaging substrate. The packaging substrate can be a laminate substrate, for example. FIGS. 21 to 25 are schematic block diagrams of illustrative packaged modules according to certain embodiments. Any suitable combination of features of these packaged modules can be implemented with each other. While duplexers are illustrated in the example packaged modules of FIGS. 21 to 25, any other suitable multiplexer that includes a plurality of filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figures 21, 22:
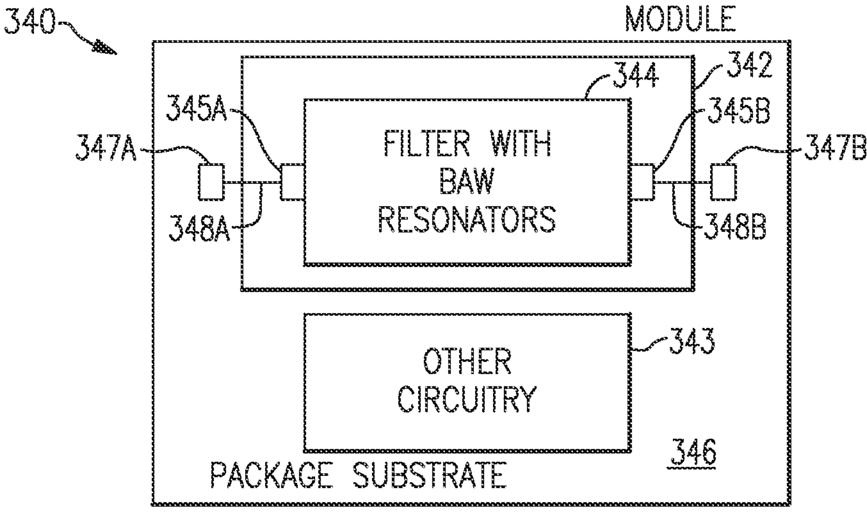
FIGS. 21, 22, 23, 24, and 25 are schematic block diagrams of illustrative packaged modules according to certain embodiments.

FIG. 21 is a schematic diagram of a radio frequency module 340 that includes an acoustic wave component 342 according to an embodiment. The illustrated radio frequency module 340 includes the acoustic wave component 342 and other circuitry 343. The acoustic wave component 342 can include one or more BAW resonators in accordance with any suitable combination of features disclosed herein. The acoustic wave component 342 can include a BAW die that includes BAW resonators.

The acoustic wave component 342 shown in FIG. 21 includes a filter 344 and terminals 345A and 345B. The filter 344 includes one or more BAW resonators implemented in accordance with any suitable principles and advantages disclosed herein. The terminals 345A and 344B can serve, for example, as an input contact and an output contact. The acoustic wave component 342 and the other circuitry 343 are on a common packaging substrate 346 in FIG. 21. The packaging substrate 346 can be a laminate substrate. The terminals 345A and 345B can be electrically connected to contacts 347A and 347B, respectively, on the packaging substrate 346 by way of electrical connectors 348A and 348B, respectively. The electrical connectors 348A and 348B can be bumps or wire bonds, for example.

The other circuitry 343 can include any suitable additional circuitry. For example, the other circuitry can include one or more radio frequency amplifiers (e.g., one or more power amplifiers and/or one or more low noise amplifiers), one or more power amplifiers, one or more radio frequency switches, one or more additional filters, one or more low noise amplifiers, one or more RF couplers, one or more delay lines, one or more phase shifters, the like, or any suitable combination thereof. The other circuitry 343 can be electrically connected to the filter 344. The radio frequency module 340 can include one or more packaging structures to, for example, provide protection and/or facilitate easier handling of the radio frequency module 340. Such a packaging structure can include an overmold structure formed over the packaging substrate 346. The overmold structure can encapsulate some or all of the components of the radio frequency module 340.

FIG. 22 is a schematic block diagram of a module 350 that includes multiplexers 351A to 351N and an antenna switch 352. One or more filters of the multiplexers 351A to 351N can include one or more BAW resonators in accordance with any suitable principles and advantages discussed herein. Any suitable number of multiplexers 351A to 351N can be implemented. The antenna switch 352 can have a number of throws corresponding to the number of multiplexers 351A to 351N. The antenna switch 352 can include one or more additional throws coupled to one or more filters external to the module 350 and/or coupled to other circuitry. The antenna switch 352 can electrically couple a selected duplexer to an antenna port of the module 350. The multiplexers 351A to 351N can include one or more duplexers.

Figures 23, 24:
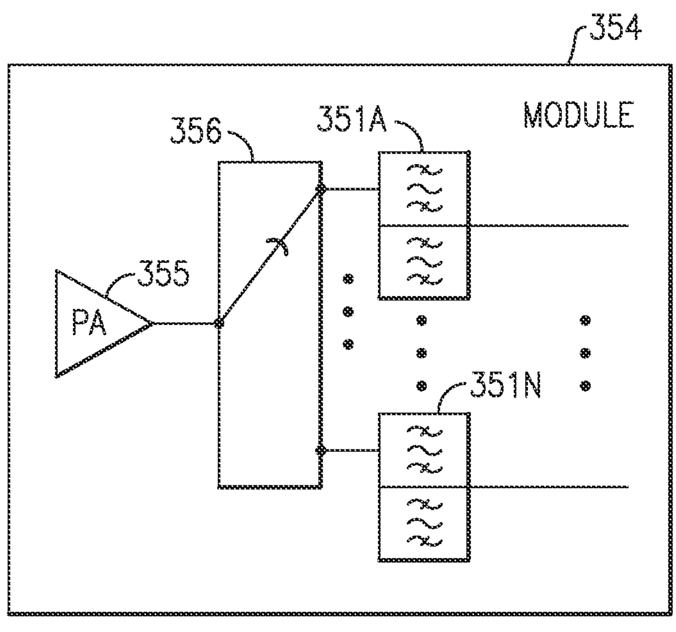

FIG. 23 is a schematic block diagram of a module 354 that includes a power amplifier 355, a radio frequency switch 356, and multiplexers 351A to 351N in accordance with one or more embodiments. The power amplifier 355 can amplify a radio frequency signal. The radio frequency switch 356 can be a multi-throw radio frequency switch. The radio frequency switch 356 can electrically couple an output of the power amplifier 355 to a selected transmit filter of the multiplexers 351A to 351N. One or more filters of the multiplexers 351A to 351N can include any suitable number of BAW resonators in accordance with any suitable principles and advantages discussed herein. Any suitable number of multiplexers 351A to 351N can be implemented.

FIG. 24 is a schematic block diagram of a module 357 that includes multiplexers 351A' to 351N', a radio frequency switch 358, and a low noise amplifier 359 according to an embodiment. One or more filters of the multiplexers 351A' to 351N' can include any suitable number BAW resonators in accordance with any suitable principles and advantages disclosed herein. Any suitable number of multiplexers 351A' to 351N' can be implemented. The radio frequency switch 358 can be a multi-throw radio frequency switch. The radio frequency switch 358 can electrically couple an output of a selected filter of multiplexers 351A' to 351N' to the low noise amplifier 359. In some embodiments (not illustrated), a plurality of low noise amplifiers can be implemented. The module 357 can include diversity receive features in certain applications.

Figure 25:
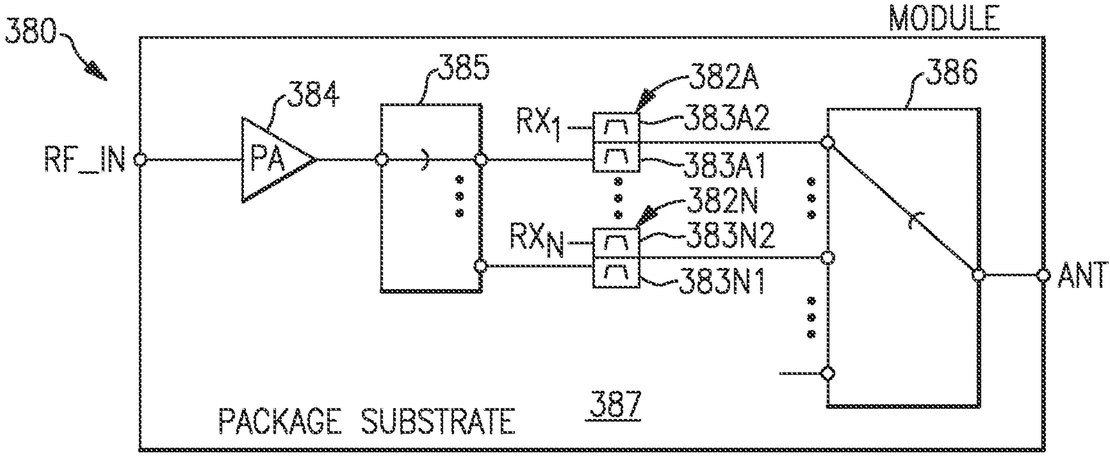

FIG. 25 is a schematic diagram of a radio frequency module 380 that includes an acoustic wave filter according to an embodiment. As illustrated, the radio frequency module 380 includes duplexers 382A to 382N that include respective transmit filters 383A1 to 383N1 and respective receive filters 383A2 to 383N2, a power amplifier 384, a select switch 385, and an antenna switch 386. The radio frequency module 380 can include a package that encloses the illustrated elements. The illustrated elements can be disposed on a common packaging substrate 387. The packaging substrate 387 can be a laminate substrate, for example. A radio frequency module that includes a power amplifier can be referred to as a power amplifier module. A radio frequency module can include a subset of the elements illustrated in FIG. 25 and/or additional elements. The radio frequency module 380 may include one or more BAW resonators in accordance with any suitable principles and advantages disclosed herein.

The duplexers 382A to 382N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters 383A1 to 383N1 can include one or more BAW resonators in accordance with any suitable principles and advantages disclosed herein. Similarly, one or more of the receive filters 383A2 to 383N2 can include one or more BAW resonators in accordance with any suitable principles and advantages disclosed herein. Although FIG. 25 illustrates duplexers, any suitable principles and advantages disclosed herein can be implemented in other multiplexers (e.g., quadplexers, hexaplexers, octoplexers, etc.) and/or in switched multiplexers.

The power amplifier 384 can amplify a radio frequency signal. The illustrated switch 385 is a multi-throw radio frequency switch. The switch 385 can electrically couple an output of the power amplifier 384 to a selected transmit filter of the transmit filters 383A1 to 383N1. In some instances, the switch 385 can electrically connect the output of the power amplifier 384 to more than one of the transmit filters 383A1 to 383N1. The antenna switch 386 can selectively couple a signal from one or more of the duplexers 382A to 382N to an antenna port ANT. The duplexers 382A to 382N can be associated with different frequency bands and/or different modes of operation (e.g., different power modes, different signaling modes, etc.).

Figure 26:
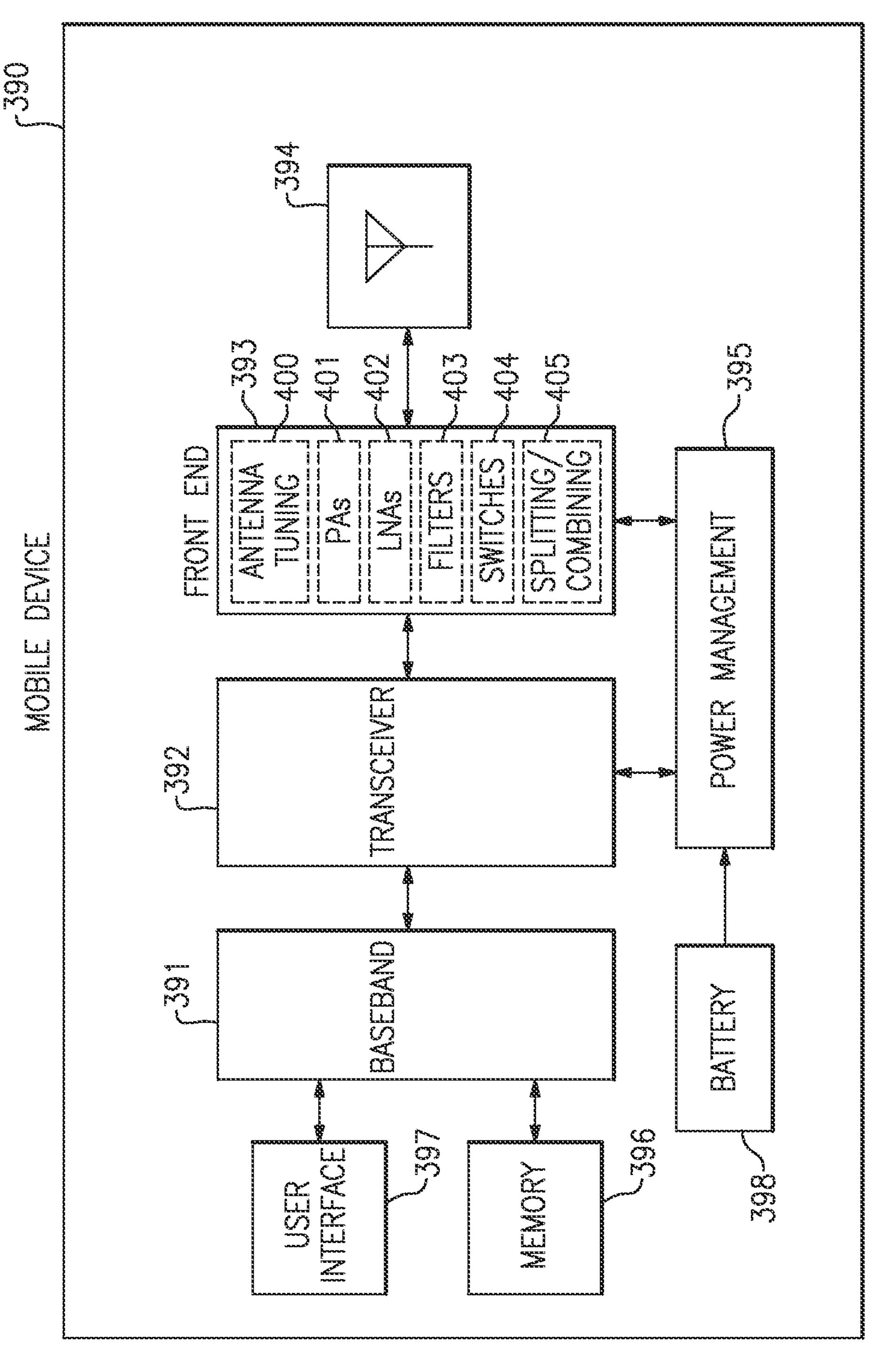
FIG. 26 is a schematic diagram of one embodiment of a mobile device.

BAW devices with stacked piezoelectric layers disclosed herein can be implemented in a variety of wireless communication devices, such as mobile devices. One or more filters with any suitable number of BAW devices implemented with any suitable principles and advantages disclosed herein can be included in a variety of wireless communication devices, such as mobile phones. The BAW devices can be included in a filter of a radio frequency front end. FIG. 26 is a schematic diagram of one embodiment of a mobile device 390. The mobile device 390 includes a baseband system 391, a transceiver 392, a front end system 393, antennas 394, a power management system 395, a memory 396, a user interface 397, and a battery 398.

The mobile device 390 can be used communicate using a wide variety of communications technologies, including, but not limited to, second generation (2G), third generation (3G), fourth generation (4G) (including LTE, LTE-Advanced, and LTE-Advanced Pro), fifth generation (5G) New Radio (NR), wireless local area network (WLAN) (for instance, WiFi), wireless personal area network (WPAN) (for instance, Bluetooth and ZigBee), WMAN (wireless metropolitan area network) (for instance, WiMax), Global Positioning System (GPS) technologies, or any suitable combination thereof.

The transceiver 392 generates RF signals for transmission and processes incoming RF signals received from the antennas 394. It will be understood that various functionalities associated with the transmission and receiving of RF signals can be achieved by one or more components that are collectively represented in FIG. 26 as the transceiver 392. In one example, separate components (for instance, separate circuits or dies) can be provided for handling certain types of RF signals.

The front end system 393 aids in conditioning signals transmitted to and/or received from the antennas 394. In the illustrated embodiment, the front end system 393 includes antenna tuning circuitry 400, power amplifiers (PAs) 401, low noise amplifiers (LNAs) 402, filters 403, switches 404, and signal splitting/combining circuitry 405. However, other implementations are possible. One or more of the filters 403 can be implemented in accordance with any suitable principles and advantages disclosed herein. For example, one or more of the filters 403 can include at least one BAW resonator with stacked piezoelectric layers including at least one piezoelectric layer formed by ALD to invert polarization in the stack in accordance with any suitable principles and advantages disclosed herein.

For example, the front end system 393 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, duplexing or triplexing), or any suitable combination thereof.

In certain implementations, the mobile device 390 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 394 can include antennas used for a wide variety of types of communications. For example, the antennas 394 can include antennas for transmitting and/or receiving signals associated with a wide variety of frequencies and communications standards.

In certain implementations, the antennas 394 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 390 can operate with beamforming in certain implementations. For example, the front end system 393 can include amplifiers having controllable gain and phase shifters having controllable phase to provide beam formation and directivity for transmission and/or reception of signals using the antennas 394. For example, in the context of signal transmission, the amplitude and phases of the transmit signals provided to the antennas 394 are controlled such that radiated signals from the antennas 394 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 394 from a particular direction. In certain implementations, the antennas 394 include one or more arrays of antenna elements to enhance beamforming.

The baseband system 391 is coupled to the user interface 397 to facilitate processing of various user input and output (I/O), such as voice and data. The baseband system 391 provides the transceiver 392 with digital representations of transmit signals, which the transceiver 392 processes to generate RF signals for transmission. The baseband system 391 also processes digital representations of received signals provided by the transceiver 392. As shown in FIG. 26, the baseband system 391 is coupled to the memory 396 to facilitate operation of the mobile device 390.

The memory 396 can be used for a wide variety of purposes, such as storing data and/or instructions to facilitate the operation of the mobile device 390 and/or to provide storage of user information.

The power management system 395 provides a number of power management functions of the mobile device 390. In certain implementations, the power management system 395 includes a PA supply control circuit that controls the supply voltages of the power amplifiers 401. For example, the power management system 395 can be configured to change the supply voltage(s) provided to one or more of the power amplifiers 401 to improve efficiency, such as power added efficiency (PAE).

As shown in FIG. 26, the power management system 395 receives a battery voltage from the battery 398. The battery 398 can be any suitable battery for use in the mobile device 390, including, for example, a lithium-ion battery.

Technology disclosed herein can be implemented in acoustic wave filters in 5G applications. 5G technology is also referred to herein as 5G New Radio (NR). 5G NR supports and/or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR. An acoustic wave device including any suitable combination of features disclosed herein be included in a filter arranged to filter a radio frequency signal in a 5G NR operating band within Frequency Range 1 (FR1). A filter arranged to filter a radio frequency signal in a 5G NR operating band can include one or more BAW devices disclosed herein. FR1 can be from 410 MHz to 7.125 GHz, for example, as specified in a current 5G NR specification. One or more BAW devices in accordance with any suitable principles and advantages disclosed herein can be included in a filter arranged to filter a radio frequency signal in a fourth generation (4G) Long Term Evolution (LTE). One or more BAW devices in accordance with any suitable principles and advantages disclosed herein can be included in a filter having a passband that includes a 4G LTE operating band and a 5G NR operating band. Such a filter can be implemented in a dual connectivity application, such as an E-UTRAN New Radio-Dual Connectivity (ENDC) application.

BAW devices disclosed herein can provide high resonant frequencies and/or desirable power ruggedness. Such features can be advantageous in 5G NR applications. For example, such filters can filter RF signals within high frequency bands. At the same time, the filters can have desirable power ruggedness for meeting 5G performance specifications at the filter level and/or at the system level.

Figure 27:
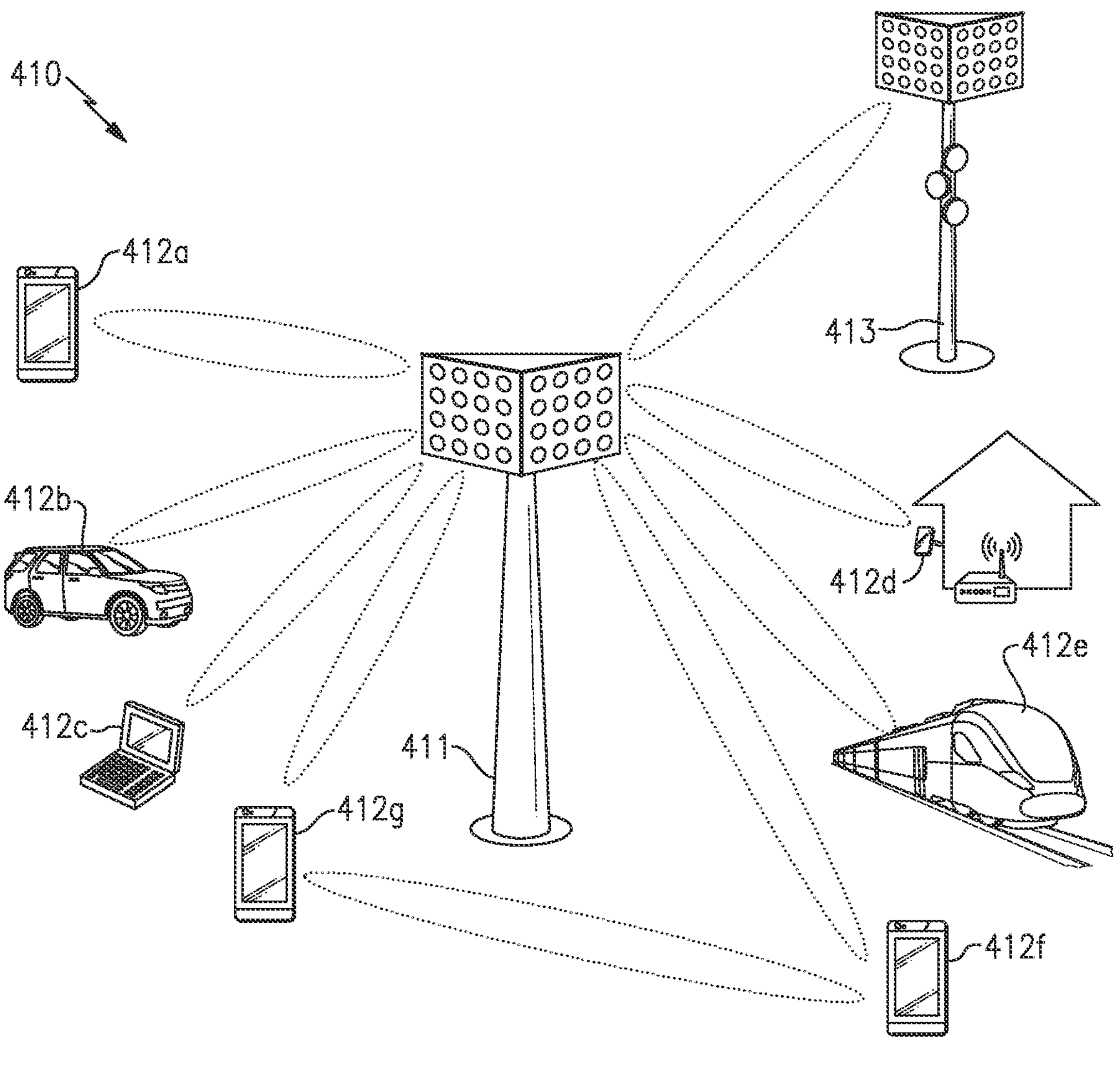
FIG. 27 is a schematic diagram of one example of a communication network.

FIG. 27 is a schematic diagram of one example of a communication network 410. The communication network 410 includes a macro cell base station 411, a small cell base station 413, and various examples of user equipment (UE), including a first mobile device 412*a*, a wireless-connected car 412*b*, a laptop 412*c*, a stationary wireless device 412*d*, a wireless-connected train 412*e*, a second mobile device 412*f*, and a third mobile device 412*g*. UEs are wireless communication devices. One or more of the macro cell base station 411, the small cell base station 413, or UEs illustrated in FIG. 27 can implement one or more of the acoustic wave filters in accordance with any suitable principles and advantages disclosed herein. For example, one or more of the UEs shown in FIG. 27 can include one or more acoustic wave filters that include any suitable number of BAW resonators in accordance with any suitable principles and advantages disclosed herein.

Although specific examples of base stations and user equipment are illustrated in FIG. 27, a communication network can include base stations and user equipment of a wide variety of types and/or numbers. For instance, in the example shown, the communication network 410 includes the macro cell base station 411 and the small cell base station 413. The small cell base station 413 can operate with relatively lower power, shorter range, and/or with fewer concurrent users relative to the macro cell base station 411. The small cell base station 413 can also be referred to as a femtocell, a picocell, or a microcell. Although the communication network 410 is illustrated as including two base stations, the communication network 410 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 410 of FIG. 27 supports communications using a variety of cellular technologies, including, for example, 4G LTE and 5G NR. In certain implementations, the communication network 410 is further adapted to provide a wireless local area network (WLAN), such as WiFi. Although various examples of communication technologies have been provided, the communication network 410 can be adapted to support a wide variety of communication technologies.

Various communication links of the communication network 410 have been depicted in FIG. 27. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 27, the communication links include not only communication links between UE and base stations, but also UE to UE communications and base station to base station communications. For example, the communication network 410 can be implemented to support self-fronthaul and/or self-backhaul (for instance, as between mobile device 412*g* and mobile device 412*f*).

The communication links can operate over a wide variety of frequencies. In certain implementations, communications are supported using 5G NR technology over one or more frequency bands that are less than 6 GHz and/or over one or more frequency bands that are greater than 6 GHz. According to certain implementations, the communication links can serve Frequency Range 1 (FR1), Frequency Range 2 (FR2), or a combination thereof. An acoustic wave filter in accordance with any suitable principles and advantages disclosed herein can filter a radio frequency signal within FR1. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 410 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 3 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 410 of FIG. 27 can be used to support a wide variety of advanced communication features, including, but not limited to, eMBB, uRLLC, and/or mMTC.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 5 GHz, in a frequency range from about 450 MHz to 8.5 GHz or in a frequency range from about 450 MHz to 10 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators described herein may be embodied in a variety of other forms. Furthermore, various omissions, substitutions and changes in the form of the resonators described herein may be made without departing from the spirit of the disclosure. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A bulk acoustic wave device with a plurality of piezoelectric layers with at least one polarization inversion, the bulk acoustic wave device comprising:

a first electrode;

a first piezoelectric layer;

a second piezoelectric layer over the first piezoelectric layer, the second piezoelectric layer formed by atomic layer deposition, and the second piezoelectric layer having an opposite polarization relative to the first piezoelectric layer;

a third piezoelectric layer over the second piezoelectric layer, the third piezoelectric layer formed by a method different than atomic layer deposition and having a same polarization as the second piezoelectric layer; and a second electrode positioned such that at least the first piezoelectric layer and the second piezoelectric layer are between the first electrode and the second electrode, the bulk acoustic wave device configured to generate a bulk acoustic wave.

2. The bulk acoustic wave device of claim 1 wherein the third piezoelectric layer is a doped piezoelectric layer.

3. The bulk acoustic wave device of claim 2 wherein the second piezoelectric layer is undoped.

4. The bulk acoustic wave device of claim 1 wherein the third piezoelectric layer is a scandium doped aluminum nitride layer.

5. The bulk acoustic wave device of claim 4 wherein the first piezoelectric layer includes scandium doped aluminum nitride.

6. The bulk acoustic wave device of claim 1 further comprising a fourth piezoelectric layer over the third piezoelectric layer, the fourth piezoelectric layer formed by atomic layer deposition, and the fourth piezoelectric layer having an opposite polarization relative to the third piezoelectric layer.

7. The bulk acoustic wave device of claim 6 further comprising a fifth piezoelectric layer over the fourth piezoelectric layer, the fifth piezoelectric layer formed by the method different than atomic layer deposition.

8. The bulk acoustic wave device of claim 1 wherein the method different than atomic layer deposition includes sputtering.

9. The bulk acoustic wave device of claim 1 further comprising a fourth piezoelectric layer over the second piezoelectric layer, the fourth piezoelectric layer formed by atomic layer deposition and having an opposite polarization relative to the second piezoelectric layer.

10. The bulk acoustic wave device of claim 1 wherein the bulk acoustic wave device is configured to excite a harmonic mode as a main mode.

11. The bulk acoustic wave device of claim 1 wherein the first piezoelectric layer and the second piezoelectric layer each include aluminum nitride.

12. The bulk acoustic wave device of claim 1 wherein the first piezoelectric layer is formed by a method different than atomic layer deposition.

13. The bulk acoustic wave device of claim 1 wherein the bulk acoustic wave device has a resonant frequency in a range from 10 gigahertz to 40 gigahertz.

14. The bulk acoustic wave device of claim 1 further comprising an interposer layer positioned between the first piezoelectric layer and the second piezoelectric layer.

15. The bulk acoustic wave device of claim 1 wherein the second piezoelectric layer includes oxygen in a polarization initiation zone.

16. An acoustic wave filter comprising:

a bulk acoustic wave resonator including a first piezoelectric layer, a second piezoelectric layer over the first piezoelectric layer, and a third piezoelectric layer over the second piezoelectric layer, the second piezoelectric layer formed by atomic layer deposition, the second piezoelectric layer having an opposite polarization relative to the first piezoelectric layer, the third piezoelectric layer formed by a method different than atomic layer deposition, and the third piezoelectric layer having a same polarization as the second piezoelectric layer; and at least one additional acoustic wave resonator, the bulk acoustic wave resonator and the at least one additional acoustic wave resonator together arranged to filter a radio frequency signal.

17. The acoustic wave filter of claim 16 wherein the at least one additional acoustic wave resonator includes a second bulk acoustic wave resonator that includes two stacked piezoelectric layers with opposite polarizations.

18. The acoustic wave filter of claim 16 wherein the bulk acoustic wave resonator has a resonant frequency in a range from 10 gigahertz to 40 gigahertz.

19. The acoustic wave filter of claim 16 wherein the second piezoelectric layer is undoped, and the third piezoelectric layer is doped.

20. A radio frequency front end comprising:

an acoustic wave filter configured to filter a radio frequency signal, the acoustic wave filter including a plurality of acoustic wave resonators, the plurality of acoustic wave resonators including a bulk acoustic wave resonator, the bulk acoustic wave resonator including a first piezoelectric layer, a second piezoelectric layer over the first piezoelectric layer, and a third piezoelectric layer over the second piezoelectric layer, the second piezoelectric layer formed by atomic layer deposition, the second piezoelectric layer having an opposite polarization relative to the first piezoelectric layer, the third piezoelectric layer formed by a method different than atomic layer deposition, and the third piezoelectric layer having a same polarization as the second piezoelectric layer; and a radio frequency amplifier coupled to the acoustic wave filter.

* * * * *